(12) United States Patent
Zuppero et al.

(10) Patent No.: US 8,642,882 B2
(45) Date of Patent: *Feb. 4, 2014

(54) ELECTRON-JUMP CHEMICAL ENERGY CONVERTER

(75) Inventors: Anthony C. Zuppero, Pollock Pines, CA (US); Jawahar M. Gidwani, San Francisco, CA (US)

(73) Assignee: Neokismet L.L.C., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/442,373

(22) Filed: Apr. 9, 2012

(65) Prior Publication Data

US 2012/0196196 A1 Aug. 2, 2012

Related U.S. Application Data

(60) Division of application No. 11/676,195, filed on Feb. 16, 2007, now Pat. No. 8,173,894, which is a continuation of application No. 10/052,004, filed on Jan. 17, 2002, now Pat. No. 7,208,767.

(60) Provisional application No. 60/262,331, filed on Jan. 17, 2001.

(51) Int. Cl.
*H01L 31/00* (2006.01)
*H01L 27/15* (2006.01)
*H01L 29/47* (2006.01)
*H02N 11/00* (2006.01)

(52) U.S. Cl.
USPC ........... 136/252; 136/253; 136/254; 310/300; 257/79; 257/471

(58) Field of Classification Search
USPC .................................................. 136/252–254
See application file for complete search history.

(56) References Cited

U.S. PATENT DOCUMENTS

| 3,694,770 A | 9/1972 | Burwell et al. |
| 3,925,235 A | 12/1975 | Lee |
| 4,012,301 A | 3/1977 | Rich et al. |
| 4,045,359 A | 8/1977 | Fletcher et al. |

(Continued)

FOREIGN PATENT DOCUMENTS

| DE | 1230509 B | 12/1966 |
| JP | 02157012 A | 6/1990 |

(Continued)

OTHER PUBLICATIONS

Aeschlimann et al., Competing Nonradative Channels for Hot Electroni Induced Surface Photochemistry, Chemical Physics 202, 127-141 (1996).

(Continued)

*Primary Examiner* — Jennifer Michener
*Assistant Examiner* — Shannon Gardner
(74) *Attorney, Agent, or Firm* — Dickstein Shapiro LLP (57) ABSTRACT

A method and a device for converting energy uses chemical reactions in close proximity to or on a surface to convert a substantial fraction of the available chemical energy of the shorter lived energized products, such as vibrationally excited chemicals and hot electrons, directly into a useful form, such as longer lived charge carriers in a semiconductor. The carriers store the excitation energy in a form that may be converted into other useful forms, such as electricity, nearly monochromatic electromagnetic radiation or carriers for stimulating other surface reactions.

5 Claims, 3 Drawing Sheets

(56) References Cited

U.S. PATENT DOCUMENTS

| | | | |
|---|---|---|---|
| 4,407,705 A | 10/1983 | Garscadden et al. |
| 4,590,507 A | 5/1986 | Capasso et al. |
| 4,634,641 A | 1/1987 | Nozik |
| 4,651,324 A | 3/1987 | Prein et al. |
| 4,686,550 A | 8/1987 | Capasso et al. |
| 4,753,579 A | 6/1988 | Murphy |
| 4,756,000 A | 7/1988 | Macken |
| 4,793,799 A | 12/1988 | Goldstein et al. |
| 4,849,799 A | 7/1989 | Capasso et al. |
| 5,048,042 A | 9/1991 | Moser et al. |
| 5,057,162 A | 10/1991 | Nelson |
| 5,293,857 A | 3/1994 | Meyer |
| 5,299,422 A | 4/1994 | Nakagawa et al. |
| 5,311,009 A | 5/1994 | Capasso et al. |
| 5,317,876 A | 6/1994 | Nakagawa et al. |
| 5,337,329 A | 8/1994 | Foster |
| 5,408,967 A | 4/1995 | Foster |
| 5,470,395 A | 11/1995 | Yater et al. |
| 5,488,231 A | 1/1996 | Kwon et al. |
| 5,525,041 A | 6/1996 | Deak |
| 5,587,827 A | 12/1996 | Hakimi et al. |
| 5,593,509 A | 1/1997 | Zuppero et al. |
| 5,632,870 A | 5/1997 | Kucherov |
| 5,641,585 A | 6/1997 | Lessing et al. |
| 5,651,838 A | 7/1997 | Fraas et al. |
| 5,674,698 A | 10/1997 | Zarling et al. |
| 5,698,397 A | 12/1997 | Zarling et al. |
| 5,736,410 A | 4/1998 | Zarling et al. |
| 5,757,833 A | 5/1998 | Arakawa et al. |
| 5,763,189 A | 6/1998 | Buechler et al. |
| 5,891,656 A | 4/1999 | Zarling et al. |
| 5,917,195 A | 6/1999 | Brown |
| 5,932,885 A | 8/1999 | DeBellis et al. |
| 5,999,547 A | 12/1999 | Schneider et al. |
| 6,067,309 A | 5/2000 | Onomura et al. |
| 6,084,173 A | 7/2000 | DiMatteo |
| 6,114,620 A | 9/2000 | Zuppero et al. |
| 6,119,651 A | 9/2000 | Anderson |
| 6,159,686 A | 12/2000 | Kardos et al. |
| 6,218,608 B1 | 4/2001 | Zuppero et al. |
| 6,222,116 B1 | 4/2001 | Zuppero et al. |
| 6,232,546 B1 | 5/2001 | DiMatteo et al. |
| 6,238,931 B1 | 5/2001 | Buechler et al. |
| 6,251,687 B1 | 6/2001 | Buechler et al. |
| 6,268,560 B1 | 7/2001 | Zuppero et al. |
| 6,312,914 B1 | 11/2001 | Kardos et al. |
| 6,327,859 B1 | 12/2001 | Zuppero et al. |
| 6,396,191 B1 | 5/2002 | Hagelstein et al. |
| 6,399,397 B1 | 6/2002 | Zarling et al. |
| 6,444,476 B1 | 9/2002 | Morgan |
| 6,537,829 B1 | 3/2003 | Zarling et al. |
| 6,649,823 B2 | 11/2003 | Zuppero et al. |
| 6,678,305 B1 | 1/2004 | Zuppero et al. |
| 6,700,056 B2 | 3/2004 | Zuppero et al. |
| 6,916,451 B1 | 7/2005 | Zuppero et al. |
| 6,944,202 B2 | 9/2005 | Zuppero et al. |
| 7,119,272 B2 | 10/2006 | Zuppero et al. |
| 7,122,735 B2 | 10/2006 | Zuppero et al. |
| 7,208,767 B2 | 4/2007 | Zuppero et al. |
| 2001/0018923 A1 | 9/2001 | Zuppero et al. |
| 2002/0017827 A1 | 2/2002 | Zuppero et al. |
| 2002/0045190 A1 | 4/2002 | Wilson et al. |
| 2002/0070632 A1 | 6/2002 | Zuppero et al. |
| 2002/0121088 A1 | 9/2002 | Zuppero et al. |
| 2002/0196825 A1 | 12/2002 | Zuppero et al. |
| 2003/0000570 A1 | 1/2003 | Zuppero et al. |
| 2003/0019517 A1 | 1/2003 | McFarland |
| 2003/0030067 A1 | 2/2003 | Chen |
| 2003/0100119 A1 | 5/2003 | Weinberg et al. |
| 2003/0166307 A1 | 9/2003 | Zuppero et al. |
| 2003/0207331 A1 | 11/2003 | Wilson et al. |

FOREIGN PATENT DOCUMENTS

| | | |
|---|---|---|
| NL | 1065463 | 4/1967 |
| WO | WO-0072384 A1 | 11/2000 |
| WO | WO-0128677 A1 | 4/2001 |
| WO | WO-0129938 A1 | 4/2001 |

OTHER PUBLICATIONS

Altukhov et al., Towards Si1-xGex Quantum-Well Resonant-State Terahertz Laser, Applied Physics Letters, vol. 79, No. 24 {2001).

Auerbach, Daniel J., Hitting the Surface-Softly, Science, vol. 294, Dec. 21, 2001, pp. 2488-2489 (2001).

Achermann, M. et al., Carrier dynamics around nano-scale Schottky contact; a femtosecond near-field study, Applied Surface Science 7659 (2002) 1-4.

Aeschlimann, M. et al., Competing nonradiative channels for hot electron induced surface photochemistry, Chemical Physics, Apr. 15, 1996, pp. 127-141, vol. 205, Issue: 1-2.

Aeschlimann, M. et al., "Ultrafast electron dynamics in metals", the Ultrafast Surface Science Group, http://www.ilp.physik.uni-essen.de/aeschlimann/2y_photo.htm.

Agranovich, V.M. et al., "New concept for organic LEDs: non-radiactive electronic energy transfers from semiconductor quantum well to organic overlayer", Elsevier Science, Synthetic Metals, 2001, vol. 116, pp. 349-351.

Albano, Ev, et al.; Adsorption-Kinetics of Hot Dimers, SciSearch Database of the Institute for Scientific Information (1999).

Altukhov, I.V. et al., Towards Sil-xGex quantum-well resonant-state terahertz laser, Applied Physics Letters, vol. 79, No. 24 (2001).

Anastassakis, E.M. et al., The Physics of Semiconductors, vol. 2, World Scientific (1990).

Armour, P. et al. "Hot-electron transmission through metal-metal interfaces: a Study of Au/Fe/Autrilayers in GaAs substrates", Applied Surface Science 123/124 (1998), pp. 412-417.

Auerbach, Daniel J. et al., "Reagent Vibrational Excitation: A Key to Understanding Chemical Dynamics at Surfaces?", abst:ract only.

Auerbach, Daniel J., "Hitting the Surface-Softly"; Science 294 (2001). pp. 2488-2489.

Avouris, P. et el., "Electron-Stimulated Catalysis Device", IBM Technical Disclosure Bulletin, vol. 25, No. 12 May 1, 1983, pp. 6378-6379. New York, US, XP002219954.

Badescu, S.C. et al., Energetics and Vibrational States for Hydrogen on Pt (111), Physical Review Letters, vol. 88, No. 13 (2002).

Balandin, A. et al., Effect of phonon confinement on the thermoelectric figure of merit of quantum wells, Journal of Applied Physics, Dec. 1, 1998, vol. 84, Issue 11 pp. 6149-6153.

Balandin, A. et al., Significant decrease of the lattice thermal conductivity due to phonon confinement in a free-standing semiconductor quantum well, Physical Review B, Jul. 15, 1998; vol. 58, Issue 3, pp. 1545-1549.

Bartels, A. et al. Coherent Zone-Folded Longitudinal Acoustic Phonons in Semiconductor Superlattices: Excitation and Detention, Physical Review Letters, vol. 82, No. 5 (1999).

Baumberg, J.J. et al., Ultrafast Acoustic Phonon Ballistics in Semiconductor Heterostructures, Physical Review Letters, vol. 78, No. 17 (1997).

Bedurftig, K. et al., Vibrational and structural properties of OH adsorbed on Pt (111), Journal of Chemical Physics, vol. 111, No. 24 (1999).

Benson, "Sodium chemiluminescence in the Na+N2O and Na-catalyzed N2O+CO Reactions," Sep. 1976, pp. 3879-3885.

Bezant, C.D. et al., Intersubband relaxation lifetimes in p-GaAs/AJGaAs quantum wells below the LO-phonon energy measured in a free elctron laser experiment, Semicon. Sci. Technol., 14 No. 8 (1999).

Bondzie, V.A. et al., Oxygen adsorption on well-defined gold particles on Ti02(110), Journal of Vacuum Science & Technology A: Vacuum, Surfaces and Films, vol. 17, Issue 4, pp. 1717-1720 (1999).

Bonn, M. et al., "Phono-Versus Electron-Mediated Desorption and Oxidation of CO on Ru(0001)," Science, vol. 285, No. 5430, Issue of Aug. 13, 1999, pp. 1042-1045.

(56) References Cited

OTHER PUBLICATIONS

Boulter, James; Laboratory Measurement of OH (X2 Di, Ö; Ü 4) Collisional Deactivation by Oxygen Atoms: http://pearll.lan.gov/WSA2002talks.pdf.

Brako, R. et al., Interaction of CO molecules adsorbed on metal surfaces, Vacuum 61, 89-93 (2001).

Bürgi, L. et al., Confinement of Surface State Electrons in Fabry-Pérot Resonators, Physical Review Letters, vol. 81, No. 24 (1998).

Bürgi, L. et al., Probing Hot-Electron Dynamics at Surfaces with a Cold Scanning Tunneling Microscope, Physical Review Letters, vol. 82 (No. 22) (1999).

Campillo, I. et al. "Inelastic Lifetimes of Hot Electrons in Real Metals", Physical Review Letters, vol. 83, No. 11, Sep. 13, 1999, pp. 2230-2233.

Casassa, M.P. et al., Time-resolved measurements of vibrational relaxation of molecules on surfaces: Hydroxyl groups on silica surfaces, Journal of Vacuum Science and Technology A: Vacuum, Surfaces and Films, vol. 3, Issue 3 (1985).

Cavanagh, R.R. et al., Vibrational relaxation of adsorbed molecules: Comparison with relaxation rates of model compunds, Journal of Vacuum Science & Technology A: Vacuum, Surfaces and Films, vol. 5, Issue 4 (1987).

Chan, H.Y.H. et al.; Methanol Oxidation on Palladium compared to Rhodium . . . ; J. Catalysis v. 174 (#2) pp. 191-200 (1998) (abstract and figure 1 only).

Chang, Y.M. et al., Observation of local-interfacial optical phonons at buried interfaces using time-resolved second harmonic generation, Physical Review B, vol. 59, No. 19 (1999).

Chang, Y.M. et al., Coherent phonon spectroscopy of GaAs surfaces using time-resolved second-harmonic generation, Chemical Physics 251, 283-308 (2000).

Chang, Y.M. et al., Observation of Coherent Surface Optical Phonon Oscillations by Time-Resolved Surface Second-Harmonic Generation, Physical Review Letters, vol. 78, No. 24 (1997).

Chang, Y.M., Interaction of electron and hole plasma with coherent longitudinal optical phonons in GaAs, Applied Physics Letter, vol. 80, No. 14 (2002).

Chen, J. et al., Stimulated-emission-induced enhancement of the decay rate of longitudinal optical phonons in III-V semiconductors; Applied Physics Letters, vol. 80, No. 16 (2002).

Chen, C. et al., "Hot electron reduction at n-Si/Au think film electrodes", Journal-of-the Electrochemical Society, vol. 139, Nov. 1992, pp. 3243-3249.

Chiang, T.C., "Photoemission studies of quantum well states in thin films", Surface Science Reports 39 (2000) pp. 181-235.

Choi, C.K. et al., "Ultrafast carrier dynamics in a highly excited GaN epilayer", Physical Review B, vol. 63, 115315, Mar. 15, 2001, 6 pages.

Chubb, D.L., et al., "Semiconductor Silicon as a Selective Emitter"; http://www.thermopv.org/TPV 5-2-05-Chubb.pdf (abstract only).

Corcelli, S.A. et al., Vibrational energy pooling in CO on NaCl (100): Methods, Journal of Chemical Physics, vol. 116, No. 18 (2002).

Cummings, M.D. et al., Ultrafast impulsive excitation of coherent longitudinal acoustic phonon oscillations in highly photoexcited InSb, Applied Physics letters, vol. 79, No. 6 (2001).

Danese, A., el al., "Influence of the substrate electronic structure on metallic quantum well state dispersions in ultrathin metal films", Prog. Surf. Sci., 67, (2001), pp. 249-258.

Davis, J.E. et al., Kinetics and dynamics of the dissociative chemisorption of oxygen Chem. Phys., 107 No. 3, Jul. 15, 1997, pp. 943-951.

DeBernardi, A. et al., "Anharmonic Phonon Lifetimes in Semiconductors from Density-Functional Perturbation Theory", Physical Review Letters, vol. 75, No. 9, Aug. 28, 1995, pp. 1819-1822.

DeKorsy, T. et al., Coherent Acoustic Phonons in Semiconductor Superlattices, phys. Stat. sp: (bA) 215, p. 425-430 (1999).

Del Fatti, N. et al., "Temperature-dependent electron-lattice thermalization in GaAs" Physical Review B, Feb. 15, 1999-1, vol. a59, No. 7, pp. 4576-4579.

Demidenko, A.A. et al., Amplification of localized acoustic waves by the electron drift in a quantum well, Semiconductor Physics, Quantum Electronics & Optoelectronics, vol. 2, No. 1 pp. 11-24 (1994).

Demidenko, A.A. et al., Generation of coherent confined acoustic phonons by drifting electrons in quantum wire: Semiconductor Physics, Quantum Electronics & Optoelectronics, vol. 3, No. 4, pp. 432-437 (2000).

Demidenko, A.A. et al., Piezoelectrically active acoustic waves confined in a quantum well and their amplifications by electron drift, Semiconductor Physics, Quantum Electornics & Optoelectronis, vol. 3, No. 4, pp. 427-431 (2000).

Denzler, D.N. et al., Surface Femtochemistry: Ultrafast Reaction Dynamics Driven by Hot Electron Mediated Reaction Pathways, World Scientific (2001).

DePaula, A.M. et al., Carrier capture via confined phonons in GaAs-AlGaAS multiple quantum wells, Selcond. Sci. Technol. 9, pp. 730-732 (1994).

DePaula, et al., Electron Transfer Times in Type-11 Superlattices Due to Emission of Confined Phonons, Appl. Phys. Lett 65 (10) (1994).

DePaula, A.M. et al., "Carrier capture processes in semiconductor superlattices due to emission of confined phonons", Appl. Phys. 77 (12) 1995 pp. 6306-6312.

Diekhoner, L. et al, Parallel pathways in menthol decomposition on Pt (111), Surface Science 409, pp. 384-391 (1998).

Diesing, D. et al., "Aluminium oxide tunnel junctions: influence of preparation technique, sample geometry and oxide thickness", Thin Solid Films, 342 (1999), pp. 282-290, received Feb. 26, 1998; accepted Sep. 11, 1998.

Diesing, D. et al., "Surface reactions with hot electrons and hot holes in metals", Surface Science, 331-333, 1995, pp. 289-293.

DiMatteo, R.S. et al., Enhanced photogeneration of carriers in a semiconductor via coupling across a nonisothermal nanoscale vacuum gap, Applied Physics Letters, vol. 79, Issue 12 (2001).

DiMatteo, R.S. et al., "Introduction to and Experimental Demonstration of Micron-gap Thermo Photo Voltaics"; http://thermopv.org/37DiMatteo.html (abstract only).

Dogwiler, Urs, et al., "Two-dimensional modeling for catalytically stabilized combustion of a lean methane-air-mixture with elementary homogeneous and heterogeneous chemical reactions", Combustion and Fame (1999), 116 (1,2), pp. 243-258.

Driskill-Smith, A.A.G. et al., "The 'nanotriode'; A nonoscale field-emission tube", Applied Physics Letters, Nov. 1, 1999, vol. 75, Issue 18, pp. 2845-2847.

Echenique, P.M. et al., "Surface-state electron dynamics in noble metals"; Prog. Surf. Sci., 67, (2001), pp. 271-282.

Endo, Makoto, et al., Oxidation of methanol by molecularly absorbed oxygen on Pt (111) under vacuum and ambient pressure conditions studied by infrared reflection absorption spectroscopy: identification of formate intrmedicate; Surf. Sci 441 (1999) L931-L937, Surf. Sci Letters.

Engstrom, Ulrika and Ryberg, Roger, "Comparing the vibrational properties of low-energy modes of a molecular and an atomic absorbate: CO and O on Pt. (111)," Journal of Chemical Physics, vol. 112, No. 4, Jan. 22, 2000, pp. 1959-1965.

Ermoshin, V.A. et al., Vibrational energy relaxation of absorvate vibrations: A theoretical study of the H/Sj (111) system, J. Chem. Phys. 105 (20) (1996).

Fan, G.Y. et al., "The oxidation of CO on Ru02 at room temperature"; J. Chem. Phys. 114, (2001) pp. 10058-10062.

Fan, Xiaofeng, Zeng, LaBounty, Chris, and Bowers, John E., Croke, Edward, Ahn, Channing C., Huttable, Scott, Majumdar, Arun, Shakourj, Ali; SiGeC/Si Superlattice microcoolers; Applied Physics Letters, vol. 78, No. 11, Mar. 12, 2001, pp. 1580-1582.

Fann, W.S. et al., Electron Thermalization in Gold. Physical Review B. Brief Reports, vol. 46. No. 20, (1992).

Fatti et al., Temperature-Dependent Electron-lattice Thermalization in GaAs, Physical Review B, vol. 59, No. 7 (1999).

Fierz, M. et al., Time-resolved 2-Photon Photoionization on Metallic Nanoparticles, Appl. Phys. B 68 (1999); http://ilp.physik.uni-essen.de/aeschlimann/abstract.htm#6.

Frederick, MD, The Solarex Guide to Solar Electricity; Solarex Corporation, Inc. pp. 66-67, Apr. 1970.

(56) References Cited

OTHER PUBLICATIONS

Frese, Karl W. et al., "Analysis of Current/Voltage Curves at n-Si/SiO2/Pt Electrodes", J. Electrochem Soc., Dec. 1994, pp. 3375-3382, vol. 141, No. 12, The Elctrochemical Society, Inc.

Frese, K.W. et al., "Hot Electron Reduction at Etched n-Si/Pt Thin Film Electrodes", Electrochem. Soc., Sep. 1994, pp. 2402-2409, vol. 103, The Electrochemical Society Inc.

Frese, et al., "Methanol Oxidation at p-Si/Pi Electrodes, Evidence for Hot Hole Reactivity", J. Phys. Chem., 1995, pp. 6074-6083, vol. 99, American Chemical Society.

Friedman, L. et al., SiGe/Si THz laser based on transitions between inverted mass light-hole and heavy-hole subbands, Applied Physics Letters, vol. 78, No. 4 (2001).

Funk, S. et al., "Desorption of CO from Ru-001—induced by near-infrared fetosecond laser pulses", Journal of Chemical Physics, vol. 112, No. 22, Jun. 8, 200, pp. 9888-9897.

Gadzuk, J.W., "Hot-electron femtochemistry at surfaces: on the role of multiple electron processes in desorption," Chemical Physics, vol. 251, Year 2000, pp. 87-97.

Gadzuk, J.W., "Multiple Electron Processes in Hot-Electron Femtochemistry at Surfaces", http://cstl.nist.gov/div837/837.03/highlite/gadzuk 1999.htm.

Gadzuk, J.W., "Resonance-Assisted Hot Electron Femtochemistry at Surfaces", Physical Review Letters, May 27, 1996, vol. 76, Issue 22, pp. 4234-4237.

Gadzuk, J.W., "Surface Femtochemistry with Fast Lasers and Slow Nonostructures", http://cstl.nist.gov/div837/837.03/highlite/previous/dietmin.htm (Date Unknown).

Gaillard, Frederick et al., Hot Electron Generation in Aqueous Solution at Oxide-Covered Tantalum Electrodes. Reduction of Methylpyridinium and Electrogenerated Chemiluminescene of Ru (bpy) 32+, Journal of Physical Chemistry B., vol. 103, No. 4, Jan. 28, 1999, pp. 667-674.

Gao, Shiwu, "Quantum kinetic theory of vibrational heating and bond breaking by hot electrons," Physical Review B, vol. 55, No. 3, Jan. 15, 1997-I, pp. 1876-1886.

Ge, N. H. et al, "Femiosecond Dynamics of Electron Localization at Interfaces," Science, vol. 279, No. 5348 AIssue of Jan. 9, 1998, pp. 202-205.

Gee, Adam T. et al., "The dynamics of 02 adsorption of Pt(553): Step mediated molecular chemisorption of Pt(533): Step mediated molecular chemisorption and dissociation", J. Chem. Phys. (2000) 113, pp. 10333-10343.

Gergen, B. et al. "Chemically Induced Electronic Excitations at Metal Surfaces," Science, vol. 294, No. 5551, Issue of Dec. 21, 2001, pp. 2521-2523.

Glavin, B.A. et al., Acoustic Phonon Generation in a Superlattice Under the Hopping Perpendicular Transport, United Nationals Educational Scientific and Cultural Organization and Internation Atomic Energy Agency (1998).

Glavin, B.A. et al., Generation of high-frequency coherent acoustic phonons in a weakly coupled superlattice, Applied Physics Letters, vol. 74, No. 23 (1999).

Guliants, ElenaA, et al., ; "A 0.5um thick polycrstalline silicone Schottky diode with rectification ratio of 106"; Appl. Phys. Let., (2002), 80, pp. 1474-1476.

Gumhalter, B. et al., "Effect of electronic relaxation on covalent adsorption reaction rates"; Phys. Rev. B (1984) 30 pp. 3179-3190.

Guo, Jingyan et al., The desorption yield dependence on wavelength of femtosecond laser from CO/CU(111), Annual Meeting of the American Physical Society, Mar. 1999, Atlanta, GA; Session BC-18—Surfaces (General), ORAL session, Mar. 21; Room 258W, GWCC (BC18.06.

Hagston, W.E. et al., Simplified treatment of scattering processes in quantum well structures, Journal of Applied Physics, vol. 90, No. 3 (2001).

Halonen, Lauri, et al., : "Reactivity of vibrationally excited methane on nickel surfaces", J. Chem. Phys. (2001) 115, pp. 5611-5619.

Harrison, P. et al., Maximizing the population inversion, by optimizing the depopulation rate, in far-infrared quantum cascade lasers (2001).

Harrison, of Far-Infrared Intersubband Lasers and Tunable Emitters, Institute of Microwaves and Photonics, University of Leeds. UK.J)p. 1-64.

Harrison, P. et al., Room temperature population inversion in SIGe TASER designs, IMP, School of Electronics and Electrical Engineering. The University of Leeds.

Harrison et al., Population—Inversion and Gain Estimates for a Semiconductor TASER.

Harrison, P. et al., Theoreticl studies of subband carrier lifetimes in an optically pumped three-level terahertz laser, superlattices and microstructures, vol. 23, No. 2 (1998).

Harrison, P. et al., The carrier dynamics of far-infrared intersubband lasers and tunable emitters, Institute of Microwaves and Photonics, University of Leeds, U.K., pp. 1-64.

Hasegawa, Y. et al., Modification of electron density in surface states; standing wave observation on Pd overlayers by STM; Surf. Sci., in press, Apr. 11, 2002.

Henry, Claude R.; Catalytic activity of supported nanometer-sized metal clusters; Applied Surf., Sci., 164 (2000) pp. 252-259.

Hess, S. et al., "Hot Carrier Relaxation by Extreme Electron—LO Phonon Scattering in GaN", http://www.physics.ox.ac.uk/rtaylor/images/hot%20carrier%20poster.pdf (Date Unknown).

Ho, Wilson; http://lassp.cornell.edu/lassp data/wilsonho.html.

Hofer, U. "Enhanced" Self-Trapping of Electrons at Surfaces, Science, vol. 279, No. 5348, Isssue of Jan. 9, 1998, pp. 190-191.

Hohlfeld, J. et al., Electron and lattice dynamics following optical excitation of metals, Chemical Physics 251, pp. 237-258 (2000).

Honkala, Karoliina et al.; "Ab initio study of 02 precursor states on the Pd(111) surface", J. Chem. Phys. (2001) 115, pp. 2297-2302.

Hou, H. et al., "Enhanced Reactivity of Highly Vibrationally Excited Molecules on Metal Surfaces," Science, vol. 284, No. 5420, Issue of Jun. 4, 1999, pp. 1647-1650.

Hou, H. et al.; "Chemical Interactions of Super-Excited Molecules on Metal Surfaces"; http://2.chem.ucsb.ed/wodtke/papers/danl.pdf.

Hou, H., et al.; "Direct Imultiquantum relaxation of highly vibrationally excited NO in collisions with O/Cu(111)", J. Chem. Phys.,110, (1999) pp. 10660-10663.

Huang, Y. et al., Observation of Vibrational Excitation and Deexcitation for NO(v=2) Scattering from Au(111): Evidence of Electron-Hole-Pair Mediated Energy Transfer. Physical Review Letters, vol. 84, No. 13 (2000).

Huang, Yuhui, et al., "Vibrational Promotion of Electron Transfer"; Science, vol. 290, Oct. 6, 2000, pp. 111-113.

Hyh, Chan et al., Methanol Oxidation of Palladium Compared to Rhodium at Ambient Pressures as Probed by Surface-Enhanced Raman and Mass Spectroscopies, Journal of Catalysis, vol. 174 (2) (1998).

IBH: "Red picosecond laser sources"; http://www.ibh.co.uk/products/light_sources/nanoled/heads/red_laserheads.htm.

IBH; "NanoLed overview"; http://ibh.co.uk/products/light_sources/light_sources/nanoled_main.htm.

vIDS, Electron-Jump Chemical Energy Converter (2 pages); James David Jacobs Esq., Jan. 6, 2003.

Iftimia, Ileana et al., "Theory of mixed classical-quantum scattering of molecules from surface"; Phys. Rev. B (2002) 65, Article 125401.

Ishikawa, Yasuyuji et al., "Energetics of H2O dissociation and COads+OHads reaction on a series of Pt-M mixed metal clusters: a relativistic density-functional study"; Surf. Sci. preprints SUSC 12830 Apr. 2002.

Johnson, R. Colin; "Molecular substitution produces terhertz switch arrays"; EE Times, (Apr. 10, 2000, 3:35p.m. EST) http://www.eet.com/story/OEG20000410S0057.

Jongma et al., Fast multiquantum vibrational relaxation of highly vibrationally excited 02; Journal of Chemical Physics; vol. 111, No. 24; Dec. 22, 1999; pp. 10957-10963.

Kao, Chia-Ling, et al., "The adsorption dynamics of molecular carbon dioxide on Pt(111) and Pd(111)", Surf Sci., (2001) Article 12570.

Katz, G. et al.; "A theoretical study of hole induced desorption", Journal of Chemical Physics, Oct. 22, 1999, vol. 111, Issue 16, pp. 7593-7598.

(56) References Cited

OTHER PUBLICATIONS

Katz, Gil et al., Non-adiabatic charge transfer process of oxygen on metal surfaces: Surf. Sci. 425 (1) (1999) pp. 1-14.
Kawakami et al., Quantum-well states in cooper thin films; Letters to nature; vol. 398; Mar. 11, 1999, www.nature.com.
Kim, M.S. et al., "Reaction of Gas-Phase Atomic Hydrogen with Chemisorbed Hydrogen Atoms on an Iron Surface," Bull. Korean Chem. Soc., vol. 18, No. 9, pp. 985-994, May 22, 1997.
Kohler, B. et al., Enhanced Electron-phonon coupling at the Mo and W (110) surfaces induced by absorbed hydrogen, mtrl-th/9510004 (1995).
Komeda, T. et al., "Lateral Hopping of Molecules Induced by Excitation of Internal Vibration Mode", Science, 295, (2002) pp. 2055-2058.
Komirenko, Sergiy M., Phonons and Phonon-Related Effects in Prospective Nanoscale Semiconductor Devices (2000).
Krauss, Todd D. et al., Coherent Acoustic Phonons in a Semiconductor Quantum Dot, Physical Review Letters, vol. 79 (No. 25) 1997.
Lee, B.C. et al., "Transmission of longitudinal optical phonons through a barrier in uniaxial crystals", Physical Review B, vol. 65, 153315, Apr. 15, 2002.
Lewis, et al., Substrate-Adsorbate Coupling in Co-Adsorbed Copper, Physical Review Letters, vol. 77, No. 26 (1996).
Lewis et al., Vibrational Dynamics of Molecular Overlayers on Metal Surfaces, Dept. of Chemistry, University of Pennsylvania, http://lorax.chem.upenn.edu/molsurf/cucotalk/html.
Lewis, S.P. et al., Continuum elastic theory of adsorbate vibrational relaxation, J. Chem. Phys. 108 (3) (1998).
Lewis, S.P. et al., Controlling adsorbate vibrational lifetimes using superlattices, Physical Review B, vol. 63, 085402 (2001).
Li, Shenping et al., "Generation of wavelength-tunable single-mode picosecond pulses from a self-seeded gain-switched Fabry-Perot laser diode with a high-birefringence fiber loop mirror", Appl. Phys. Let. 76 (2000) pp. 3676-3678.
Luglit, P. et al., Interaction of electrons with interface phonons in GaAs/AIAs and GaAs/AIGAs heterostructures, Semicond. Sci. Technol. 7 (1992).
Mahan, G.D. et al., "Multilayer thermionic refrigerator and generator," Journal of Applied Physics, vol. 83, No. 9, May 1, 1998.
McCabe, R.W., et al., Kinetics and Reaction Pathways of Methanol Oxidation on Platinum; J.Phys. Chem. 1986, 90, pp. 1428-1435.
Mitsui, T. et al.; "Coadsorption and interactions of O and H on Pd(111)"; Surf.Sci., Article 12767, (2002).
Moula, Md. Golam et al., "Velocity distribution of desorbing CO2 in CO oxidation on Pd(110) under steady-state conditions"; Applied Surf. Sci. 169-170, pp. 268-272 (2001).
Mulet, Jean-Philippe et al., Nanoscale radiative heat transfer between a small particle and a plane surface, Applied Physics Letters, vol. 78, No. 19 (2001).
Murphy, M.J. et al., "Inverted vibrational distributions from N2 recombination at Ru(001): Evidence for a metastable molecular chemisorption well" Journal of Chemical Physics, vol. 110, No. 14, pp. 6954-6962, Apr. 8, 1999.
NANOLITE, "NANOLITE Sparkflashlamp", http://www. hsps.com/products/nanolaen.htm (Date Unknown).
Nienhaus, H. et al., "Electron-hole pair creations by reactions at metal surface", downloaded from www.aps.org/meet/CENT 99/BAPS.abs S6980001.html. American Physical Society Centennial Meeting Program, Atlanta, GA Mar. 20-26, 1999.
Nienhaus, H. et al., Direct detection of electron-hole pairs generated by chemical reactions on metal surfaces, Surface Science 445, pp. 335-342 (2000).
Nienhaus, H. et al., "Electron-Hole Pair Creation at Ag and Cu Surfaces by adsorption of Atomic Hydrogen and Deuterium," Physical Review Letters, vol. 82, Issue 2, Jan. 11, 1999, pp. 446-449.
Nienhaus, H. et al., "Selective H atom sensors using Ultrathin Ag/Si Schottky diodes," Applied Physics Letter, Jun. 28, 1999, vol. 74, Issue 26, pp. 4046-4048.
Nienhaus, Hermann, Electronic excitations by chemical reactions on metal surfaces, Surfaces Science Reports 45, pp. 1-78 (2002).

Nolan, P.D. et al., "Direct verification of high-translational-energy molecular precursor to oxygen dissociation on Pd (111), "Surface Science vol. 419, pp. L107-L113, Dec. 24, 1998.
Nolan, P.D. et al., Molecularly chemisorbed intermediates to oxygen adsorption on Pt (111): A molecular beam and electron energy-loss spectroscopy study, Journal of Chemical Physics, vol. 111, No. 8, pp. 3696-3704.
Nolan, P.D. et al., "Translational Energy Selection of Molecular Precursors to Oxygen Adsorption on Pt. (111), "Physical Review Letters, vol. 81, No. 15, pp. 3179-3182, Oct. 12, 1998.
Ogawa, S. et al., Optical Intersubband Transitions and Femtosecond Dynamics in Ag/Fe (100) Quantum Wells, Physical Review Letters, vol. 88, No. 11 (2002).
Otto, Andreas et al., "Role of Atomic Scale Roughness in Hot Electron Chemistry, "Journal of Physical Chemistry B, vol. 103, No. 14. Apr. 8, 1999, pp. 2696-2701.
Ozgür, Ümit et al., Control of Coherent Acoustic Phonons in InGaN Multiple Quantum Wells, arXiv:cond-mat/0010170 (2000).
Paggel, J.J. et al., Quantum well photoemission from atomically uniform Ag filmes: determination of electronic band structure and quasi-particle lifetime in Ag(100) Applied Surface Science 162-163, pp. 78-85 (2000).
Paggel, J.J. et al., "Quantum-Well States as Fabry-Pérot Modes in a Thin-Film Electron Interferometer"; Science, 283, (1999), pp. 1709-1711.
Paggel, J.J. et al., "Quasiparticle Lifetime in Macroscopically Uniform Ag/Fe(100) Quantum Wells", Phys. Rev. Letter (1998) 81, pp. 5632-5635.
Park, Hongkun et al., "Nanomechanical ascillations in a singe-C60 transistor", Letters to Nature, vol. 407, Sep. 7, 2000, www.nature.com, pp. 57-60.
Persson, M. et al., A first-principles potential energy surface for Eley-Rideal reaction dynamics of H atoms on Cu(111), Journal of Chemical Physics, vol. 110, No. 4 (1999).
Phihal, M. et al., "Role of intra-adsorbate Coulomb correlations in energy transfer at metal surfaces", Physical Review B, Jul. 15, 1998, vol. 58, Issue 4, pp. 2191-2206.
Pontius, N. et al., "Size-dependent hot-electron dynamics in small Pdn clusters", Journal of Chemical Physics, Dec. 8, 2001, vol. 115, Issue 22, pp. 10479-10483.
Prabhu, S.S. et al., Femtosecond energy relaxation of nonthermal electorns injected in p-doped GaAs base of a heterojunction bipolar transistor, Journal of Applied Physics, vol. 90, No. 1 (2001).
Prieur et al., "Sound Ampl;ification by Stimulated Emission of Radiation in an Amorphous Compund," Europhysics Letters, 24 (5) (1993), pp. 409-414.
Prybyla, J.A. et al., Femtosecond Time-Resoved Surface Reaction: Desorption of CO from Cu (111) in 325 fsec;, Physical Review Letters, Jan. 27, 1992, vol. 68, Issue 4, pp. 503-506.
Qiu, T. et al., Long-distance propagation and damping of low-frequency phonon polaritions in LiNb03, Physical Review B, vol. 56, No. 10 (1997).
Qu, J. et al., Long-lived phonons, Physical Review B, vol. 48, No. 9 (1993).
Ree, J., et al., "Dynamics of Gas-Surface Interactions: Reaction of Atomic Oxygen with Chemisorbed Hydrogen on Tungsten", Journal of Physical Chemistry, vol. 101 (#25), pp. 4523-4534, Jun. 19, 1997.
Ree, J. et al., "Reaction of atomic oxygen with adsorbed carbon monoxide on a platinum surface," Journal of Chemical Physics, vol. 104, Issue 2, pp. 742-757, Jan. 8, 1996.
Rettner et al.. Dynamics of the Chemisorption of 02 on Pt(111}: Dissociation via Direct Population of a Molecularly Chemisorbed Precursor at High Incidence Kinetic Energy, The Journal of Chemical Physics, vol. 94, Issue 2 (1991).
Rinnemo, Mats; "A Study of Catalytic Ignition and Kinetic Phase Transitions"; 1996; http://www.2.lib.chalmers.se/cth/diss/doc/9596/RinnemoMats.html.
Robertson, A.J.B.; et al., "Catalysis of Gas Reactions by Metals"; Logos Press Limited; 1970; LC #70-80936; pp. 1-5, 10, 41 Great Britain, Adlard & Son Ltd.
Rousse, a. et al., Non-thermal melting in semiconductors measured at femtosecond resolution, Nature, vol. 410 (2001).

(56) References Cited

OTHER PUBLICATIONS

Saalfrank, P. et al., "Quantum dynamics of bond breaking in a dissipative environment; Indirect and direct photodesorption of neutrals from mets", Chem. Ohy. 105 (6), Aug. 8, 1996, pp. 2441-2454.
Schelling, P.K. et al., Phonon wave-packet dynamics at semiconductor interfaces by molecular-dynamics simulation, Applied Physics Letters, vol. 80, No. 14 (2002).
Schewe, P. et al., "CO2 Production at the Single-Molecule Level"; http://www.aip.org/enews/physnews/2001/split/561-1.html.
Schonnhammer et al., "Energy Dissipation at Metal Surfaces: Electronic Versus Vibrational Excitations," Journal of Electron Spectroscopy and Related Phenomena (1983), pp. 91-103.
Sheng, H. et al., "Schottky diode with Ag on (1120) epitaxial ZnO film"; Appl. Phys. Let. (2002) 80, pp. 2132-2134.
Shikin, A.M. et al., Phase accumulation model analysis of quantum well resonances formed in ultra-thin Ag, Au filmes on W(110), Surface Science (2001).
Shin, H.K. et al., "Vibrationally Excited OD Radicals From the Reaction of Oxygen-Atoms with Chemisorbed Deuterium on Tungsten," Journal of Physical Chemistry, vol. 102 (#13), pp. 2372-2380, Mar. 26, 1998.
Smit, G.D.J., Enhanced tunneling across nanometer-scale metal-semiconductor interfaces; Appl. Phys. Let (2002) 80, pp. 2568-2570.
Snow, E.S. et al., Ultrathin PtSi layers patterned by scanned probe lithography ; Appl. Phys. Let. (2001) 79, pp. 1109-1111.
Soref, R.A. et al., Terhertz gain in a SiGe/Si quantum staircase utilizing the heavy-hole inverted effective mass, Applied Physics Letters, vol. 79, No. 22 (2001).
Soref et al., Terhertz Gain in a SiGe/Si Quantum Starcase Utilizing the Heavy-Hole Inverted Effective Mass, Apolied Physics Letters, vol. 79, No. 22 (2001).
Spetz, Lloyd et al., "High Temperature Sensors Based on Metal-Insulator-Silicon Carbide Devices," Jan. 1997, pp. 493-511.
Stanton, N.M. et al., Energy relaxation by hot electrons in n-GaN epilayers, Journal of Applied Physics, vol. 89, No. 2 (2001).
Steinbrüchel et al., "Energy Dissipation in Catalysis", University of Minnesota, Aug. 1973, pp. 267-270.
Stipe, B.C. et ak., "Atomistic studies of 02 dissociation on Pt (111) induced by photons, electrons, and by heating," Journal of Chem. Phys. , vol. 107 (16), Oct. 22, 1997, pp. 6443-6447.
Stromquist, J. et al., The dynamics of H absorption in and adsorption on Cu (111), Surface Science 397, pp. 382-394 (1998).
Sun, G. et al., Intersubband lasing lifetimes of SiGe/Si and GaAs/AlGaAs multiple quantum well structuress, Applied Physics Letters, vol. 66, No. 25 (1995).
Sun et al., Pheonon-Pumped Terhertz Gain in n-Type GaAsJA1GaAs Superlattices, Applied Physic Letters, vol. 7, No. 22 (2001).
Sun, G. et al., Phonon Pumped SiGe/Si Interminiband Terahertz Laser, pp. 1-11.
Sun, C.K. et al., "Fetosecond studies of carrier dynamics in InGaN"; Applied Phys. Letter (1997) 70 pp. 2004-2006.
Sung, Y.E. et al. "Enhancement of Electrochemical Hot Electron Injection into Electrolyte Solutions at Oxide-Covered Tantalum Eletrodes by Thin Platinum Films", Journal of Physical Chemistry B., vol. 102, No. 49, Dec. 3, 1998 pp. 9806-9811.
Sung, Y.E. et al., "Demonstration of Electrochemical Generation of Solution-Phase Hot Electrons at Oxide-Covered Tantalum Electrodes by Direct Electrogenerated Chemiluminescence", J. Phys. Chem, 1998, pp. 9797-9805, vol. 102, American Chemical Society.
Surowiak et al., "Structure and Certain Physical Properties of BaTi03 Thin Films with Diffused Phase Transition," XP-002355326, 1 page.
Svensson, K. et al., "Dipole Active Vibrational Motion in the Physisorption Well"; Phys. Rev. Lett., 78 (1997) pp. 2016-2019.
Takaoka, G.H. et al., "Presentation and catalytic activity of nanoscale Au islands supported on Ti02", Nuclear Instruments & Methods in Physics Research, Section-B: Beam interactions with Materials and Atoms, North-Holland Publishing Company, Amsterdam, NL., vol. 121, No. 1, 1997, pp. 503-506, XP904057973, abstract.

Tarver, Craig M.; "Non-Equilibrium Chemical Kinetic Effects in Explosive Reactive Flows"; Fall 1999 IMA Workshop: High-Speed Combustion in Gaseous and Consensed-Phase.
Taylor et al., "Phonon Focusing in Solids," Jun. 1969, pp. 416-420.
Taylor, R.A. et al., Strong Electron-LO Phonon Scattering and Hot Carrier Relaxatin in GaN, Abrast No. ha249KW3 http://uk./rtaylor.images/ha249kw3.pdf.
Teodorescu, C.M. Structure of Fe layers grown on InAs(100); Appl. Surf. Sci., 166, (2000) pp. 137-142.
Tiusan, C. et al., Quantum coherent transport versus diode-like effect in semiconductor-free metal/insulator structure, Applied Physics Letters, vol. 79, No. 25 (2001).
Tobias et al., "Fast chemical Sensing with Metal-Insulator Silicon Carbide Structures," Jun. 1997, pp. 287-289.
Tom, Harry W.K. et al., Coherent Phonon and Electron Spectroscopy on Surfaces Using Time-Resolved Second-Harmonic Generation.
Tripa, C. Emil et al., Surface-aligned photochemistry: aiming reactive oxygen atoms along a single-crystal surface, Journal of Chemical Physics, vol. 112, No. 5 (2000).
Tripa, C. Emil et al., "Kinetics measurements of CO photo-oxidation on Pt(111)," Journal of Chemical Physics, vol. 105, Issue 4, pp. 1691-1696, Jul. 22, 1996.
Tripa, C. Emil et al., "Surface-aligned reaction of photogenerated oxygen atoms with carbon monoxide targets"; Nature 398, pp. 591-593 (1999).
Tripa, C. Emil et al., "Special Adsorption and Reaction Effects at Step Defect Sites on Platinum . . . "; http://www.chem.pitt.edu/thesis.html#tripa (abstract only).
Tsai, Chin-Yi et al., Theoretical modeling of nonequilibrium optical phonons and electron energy relaxation in GaN, Journal of Applied Physics, vol. 85, No. 3 (1999).
Tully, John C. et al., Electronic and phonon mechanisms of vibrational relaxation: CO on Cu (100), J. Vac. Sci Technol. A 11(4) (19930.
Ultrafast Surface Dynamics Group, Time-Resolved Two-Photon Photoemission (TR-2PPE), htto:Ilwww.ilo.ohvsik.uni-essen.de/aeschlimannl2v photo.htm.
Valden, et al., Onset of Catalytic Activity of Gold Clusters on Titania with the Appearance of Nonmetallic Properties, Science, vol. 281 (1998).
Vale, R.D. et al., "The Way Things Move: Looking Under the Hood of Molecular Motor Proteins", Science, vol. 2888, Apr. 7, 2000, www.sciencemag.org, pp. 88-95.
Völkening, S. et al., "CO oxidation on Pt(111)—Scanning tunneling microscopy experiments and Monte Carlo simulation", Chem. Phys. (2001) 114, pp. 6382-6395.
Wanke, Michael C. et al., Injectorless quantum-cascade lasers, Applied Physics Letters, vol. 78, No. 25 (2001).
Watson, D.T.P. et al., "Isothermal and temperature-programmed oxidation of CH over Pt (110) (1×2)"; Surf. Sci. preprint, year 2001.
Watson, D.T.P. et al., "Surface products of the dissociative adsorption of methan on Pt(110)-(1×2)"; Surf. Sci. prepring, c. Oct. 2001.
Weber, G. Carrier capture processes in GaAs-AlGaAs quantum wells due to emission of confined phonons, Appl. Phys. Letter 63 (22) (1993).
Weber, G. et al., to Xz electron transfer times in Type-11 GaAs/AlAs superlattices due to emission of confined and interface phonons, superlattices and microstructures, vol. 23, No. 2 (1998).
Weinberg, Henry et al., Direct detection of electron-hole pairs generated by chemical reactions on metal surfaces, 2000 Elsevier Science B.V., Surface Science, pp. 335-342.
Weinberg, Henry et al., Elctron-Hole Pair Creation at Af and Cu Surfaces by Adsorption of Atomic Hydrogen and Deuterium, 1999 The American Physical Society, Physical Review Letters, vol. 82.
White, J.M. Using photons and electrons to drive surface chemical reactions, Journal of Molecular Catalysis A: Chemical 131, 1998, pp. 71-90.
Wilke, Steffen et al., "Theoretical investigation of water formation on Rh and Pt Surfaces"; J. Chem. Phys., 112, (2000) pp. 9986-9995.
Wintterlin, J. et al., Atomic and Macroscopic Reaction Rates of a Surface-Catalyzed Reaction, Science, 278 (1997) pp. 1931-1934.

(56) References Cited

OTHER PUBLICATIONS

Wintterlin, J. et al., Existence of a "Hot" Atom Mechanism for the Dissociation of 02 on Pt(112), Phys. Rev. Lett., 77, (1996), pp. 123-126.

Witte, Gregor et al., Low frequency vibrational modes of adsorbates, Surface Science, No. 1362 (2002).

Xu, W. et al., Electrical generation of terahertz electromagnetic pulses by hot-electrons in quantum wells, Superlattices and Microstructures, vol. 22, No. 1 (1997).

Yates, John et al., Special Adsorption and Reaction Effects at Step Defect Sites on Platinum Single Crystal Surfaces (2000).

Yeo, Y.Y. et al., Calorimetric Heats for CO and oxygen adsorptin and for the catalytic CO oxidation reaction on Pt(111). J. Chem. Phys. 106 (1) (1997).

Yeo et al., Calorimetric Investigation of NO and O adsorptin on Pd(100) and the Influence of Preadsorbed Carbon, J. Chem. Phys. 106 (5) (1997).

Zambelli, T. et al., Complex pathways in dissociative adsorption of oxygen on platinum, Nature, vol. 390 (1997).

Zhdanov, V.P. et al., "Substrate-mediated photoinduced chemical reactions on ultrathin metal films", Surface Science, 1999, pp. L599-L603, vol. 432, Elsevier Science B.V.

Zhdanov, V.P. et al., Nm-sized metal particles on a semiconductor surface, Schottky model, etc., Surface Science, SUSC 2931 (2002).

Zhu, X.Y. et al., "Surface photochemistry: from hot reactions to hot materials", Surface Science, vol. 390, (1997), pp. 224-236.

Zhukov, V.P. et al., "Lifetimes of quasiparticle excitations in 4d transition metals: Scattering theory and LMTO-RPA-GW approaches", Phys. Rev. B (2002) 65, Article 115116.

Zavtrok et al., "SASER (Sound Amplificaation by Stimulated Emission of Radiation)," Apr. 1997, pp. 406-414.

ELECTRON-JUMP CHEMICAL ENERGY CONVERTER

CROSS-REFERENCE TO RELATED APPLICATIONS

This application is a Divisional of U.S. patent application Ser. No. 11/676,195 filed Feb. 16, 2007, now U.S. Pat. No. 8,173,894, which is a continuation of Ser. No. 10/052,004 filed Jan. 17, 2002, U.S. Pat. No. 7,208,767, which claims the benefit of U.S. Provisional Patent Application No. 60/262,331, filed Jan. 17, 2001.

TECHNICAL FIELD OF THE INVENTION

The present invention relates generally to a method and device to generate electric power or to extract power by stimulated emission, and more specifically to a method and device to convert the chemical energy of reactions on a catalytic surface into useful forms, such as long lived carriers in a semiconductor, electricity or coherent radiation.

BACKGROUND OF THE INVENTION

One method to convert chemical reactant energy directly into useful work such as electricity uses electrochemical couples such as batteries and fuel cells. In this method, a substantial fraction of the reactant bond energies may be converted directly into electrical potential. However, the physical chemistry underlying these processes limits the rate of such conversion substantially. The result of the electrochemical conversion method is a power per mass and power per volume in a real device, such as a battery or fuel cell, that is at least an order of magnitude smaller than that of a mechanical engine.

Another method uses gas dynamic processes to convert chemical energy directly into a dynamic state exhibiting a population inversion. Stimulated emission extracts this energy from this reactants in the form of coherent radiation. However, the efficiency is substantially below that of electrochemical and mechanical methods, and the reactants and exhausts of this method are usually dangerous and incompatible with human safety considerations. Moreover, these devices cannot be efficiently miniaturized.

Therefore, it is highly desirable to have a compact method and system for chemical extracting energy efficiently without having to use harmful products and without producing hazardous byproducts in the process.

A recent surface sensor research has shown that during the adsorption event when chemical specie such as atoms or molecules adsorb on the surface of metal, hot charge carriers are emitted. "Hot" means with an energy several or many times that associated with the 0.026 electron volts (eV) of room temperature. The observed hot carriers showed energy in excess of the Schottky barrier of approximately 0.6 eV. Therefore, it is highly desirable to use energized specie to generate the hot carriers and/or collect the hot carriers.

Recent experimental and theoretical developments in surface science showed that gas molecules vibrating with an energy nearly sufficient to break their chemical bonds (quantum number of order 15) deposit nearly all this energy into a metal surface at the moment of contact, and bounce off the surface with much less vibrational energy (quantum number of order 5). That the molecule should loose many quanta all at once in the period of order 100 femto-seconds was unexpected. This explanation is called an "electron jump," where an electron from the metal surface jumps on to the energetically vibrating molecule just as the molecule approaches the surface. The electron then jumps back into the metal, taking with it most of the vibrational energy.

Implicit in this electron jump observation is that the bond energy transfers to an electron. There are few if any available mechanical modes to accept the energy because the Debye frequency of the metal substrates is at least 1 to 2 orders of magnitude lower than the frequency of the excitations. Electrons may accept the energy because the metal surface has a high density of electron states available to accept the energy.

The electron jump research implies, but did not measure, that an electron carries away a majority of the energy contained in the energized bond. The electron jump research does not attempt to measure or detect such a hot electron. Other observations of surface effects, theory and the surface sensor research strongly implicate that an electron takes the energy. Observations strongly support the theory of prompt, multi-quantum energy transfer to an electron from a vibrationally excited chemical specie in brief contact (of order 0.1 pico-seconds) with the substrate metal surface. Accordingly, it is desirable to have a method and device to convert the chemical energy of a reaction of fuel and oxidizer on a catalyst surface into electrical energy. It is also desirable to use fuel and oxidizer to create the highly energetic specie directly in contact with a catalyst surface.

SUMMARY OF THE INVENTION

The method and apparatus of the present invention in one embodiment uses catalysts, fuels and oxidizers to convert a substantial fraction of the available chemical energy of reactants, also referred to as energized products, into a useful form such as long lived charge carriers ("carriers") in a semiconductor. The carriers in one embodiment store the excitation energy in a form that may be used and converted into other useful forms. For example, the carriers may be ultimately converted into electricity or a coherent beam of radiation, to provide stimulation carriers for further surface reactions, to cause a mechanical effect in a nano-mechanical system and/or to provide carriers in a semiconductor that would otherwise be provided by a power supply.

The method and apparatus of the present invention in one embodiment captures the charge carriers released when chemically excited specie transfer a substantial fraction of the excitation energy all at once into the substrate lattice. The substrate lattice provides a method to conserve momentum and the substrate electrons provide a channel to conserve energy in that transfer process. Such excitations include energetic holes as well as energetic electrons. The method of the present invention includes forming catalyst and substrate structures thin enough so that the excited carrier transfer occurs with minimum energy loss. This thickness may be between one and thousands of monolayers of material depending on electron energy and material, and can be fabricated according to the current state of the art.

In one embodiment, an energy converter may be used to capture the charge carriers or electromagnetic energy emitted by the energized products on or in close proximity to the reacting surface. The energy converter may be also used to convert the charge carriers into a useful form. The energy converter such as the one disclosed in the present invention may be used. Alternatively, other known energy converters may be used. Such known energy converters may include any known device designed to capture the charge carriers or electromagnetic energy emitted by the energized products on or in close proximity to the reacting surface, such as devices used in photovoltaic energy converters, metal-insulator-metal devices, metal-oxide-metal devices, quantum wells and semiconductor devices. Examples of known energy converting devices are described in U.S. Pat. Nos. 4,686,550, 4,590,507, and 4,694,318.

The term "close proximity" refers to the case where the charges travel ballistically and equivalently to where the electric and magnetic fields are evanescent and not propagating waves, which dimension is typically less than 100 nanometers. One example of an energy converter in the present invention is a semiconductor diode junction, such as p-n junction or a Schottky junction.

In one embodiment, an energy converter in the present invention converts the flood of carriers injected into the semiconductor into coherent optical radiation. Similar types of diodes and methods that are used in the direct conversion of a diode forward bias into a population inversion and coherent radiation may be used. In such diodes, energy is extracted using stimulated emission. These diodes typically use direct bandgap semiconductors that are degeneratively doped. The p-n junction diode of the present invention also may use highly doped or doping at the high limit, degeneratively doped, semiconductors and direct bandgap semiconductors.

Further features and advantages of the present invention as well as the structure and operation of various embodiments of the present invention are described in detail below with reference to the accompanying drawings. In the drawings, like reference numbers indicate identical or functionally similar elements.

BRIEF DESCRIPTION OF THE DRAWINGS

Preferred embodiments of the present invention will now be described, by way of example only, with reference to the accompanying drawings in which.

DETAILED DESCRIPTION OF THE INVENTION

The present invention is directed to converting a substantial fraction of the available chemical energy of reactants into electrical or other forms of energy. In one embodiment, chemical reactants are used to supply the energy. In one embodiment, one or more catalysts are used to form energized reaction products, or energized chemical products, in the near-field proximity to or on an energy converter. Energy forms, also referred to as excitations, are emitted by the energized reaction products. Examples of the energy forms include hot electron, hot hole, or electromagnetic radiation. The energy converter is used to collect and transfer the energy forms. The region where the energized chemical products form is also referred to as the surface or the reacting surface.

In one embodiment, the present invention uses fuel (electron donor), such as hydrocarbon, methanol, ethanol, hydrogen or the products of a fuel reformer, and an oxidizer (electron acceptor), such as air or hydrogen peroxide, to create the highly excited vibration state chemical products. Reactants enter the region of reaction, which may include one or more catalysts on a reaction surface. When the apparatus of the present invention generates continuous power, exhaust products also may leave the region.

The method and apparatus of the present invention generates highly vibrationally excited specie directly on the catalyst surface by catalytic reaction of fuel, such as methanol, and oxidizer, such as air. Since an electron transfer occurs just at the moment when the vibrationally excited specie contacts the surface of a metal, and the electron carries with it a large fraction of the reaction energy, generating highly vibrationally excited specie directly on the catalyst surface has many advantages. "Contact" here means when the chemical specie comes close enough to the surface that non-propagating electromagnetic fields may dominate the interaction. This contact distance is typically much less than 1 micron and may be in excess of tens of nanometers.

The method of the present invention also includes forming the catalysts, substrates, interconnections and substrates such that the distance from the reacting chemicals to the energy converter is less than approximately 4 times the various energy mean free paths of the forms of energy going into the energy converter.

The method also includes choosing fuels from any one of any reducing material or electron donor, including but not limited to hydrogen, hydrocarbons, alcohols such as methanol, ethanol and propanol, carbohydrates, and the products of a fuel reformer such as hydrogen and carbon monoxide. Oxidizers may include any one of electron acceptors, oxygen, air, hydrogen peroxide and halogens.

The method includes forming the catalyst in any one of many different configurations, each configuration having particular features. The catalyst can be formed in any way including but not limited to clumps, monolayers, clusters, ridges, step edges, quantum wells and quantum stadia. Configurations with edges and ridges may show the advantage of active sites for adsorption and reaction. Configurations with monolayers may show the advantage of tailoring and causing resonances and peaks in the density of states of electrons near the Fermi surface, enhancing the transfer of energy at those energies. Clusters may show the advantage of enhanced ballistic electron lifetimes and decoupling from surface phonon states, increasing efficiency.

The method for a continuous power generator in one embodiment of the present invention includes choosing catalysts where the products of the reaction desorb and rapidly leave the catalyst surface. The method also includes choosing a catalyst or set of catalysts that readily react with the input reactants. Such catalysts have been known to those skilled in the technological art, e.g., since the time (1800's) when ethanol or methanol was observed reacting at a room temperature with air on wool or fine particle catalysts made of platinum or palladium.

The method and apparatus of the present invention in one embodiment injects or transfers the energetic charge carrier resulting from the interaction of a surface and the energetically excited products into the semiconductor diode to create an excess of cited carriers in that diode. This excess of excited carriers also creates a potential across the diode. Similarly, the method and apparatus of the present invention transfers or injects the energetic charge carriers into a semiconductor or quantum well system.

The method and system of the present invention in one embodiment efficiently collects and converts the resulting energy into electric power, for example using a forward biased semiconductor diode, or into an inverted population of excitations in a semiconductor or quantum well, which excitations can be converted into other useful forms of energy.

In one embodiment of the present invention, chemical reactions may be used to generate the carriers instead of an applied voltage. Chemical reactions may also be used to power devices that would otherwise be powered by a source of electricity. For example, chemical reactions may also be used to power chips sets. Using chemical reactions to power chips sets permits the construction of volume, three dimensional computing systems, where the energy source to power them is a flow fuel-oxidizer mixture.

In one embodiment, the present invention uses and energizes a quantum well as the energy converter. An energy converter of the present invention transforms a short-lived carrier into a longer-lived carrier so that the carrier may be used. Using a quantum well substrate including a tunneling barrier, a metal or semiconductor and another tunneling barrier is a way to form the energy converter. This energy converter may be also formed in direct contact with the substrate, catalyst and reactants. The resonance levels formed by the quantum well provide temporary states to convert the ballistic carrier into a trapped, longer lived excitation of the quantum well. One way the present invention uses to extract the energy from the quantum well is through stimulated emission of radiation. Another way the present invention uses to extract the energy is through generation of a potential. Yet another way is to power nanodevices directly connected to the present invention.

The current state of the art associated with quantum well structures and semiconductors permits layers whose dimensions are of the same order of magnitude as the energy mean free path of the ballistic carriers involved.

The method and apparatus of the present invention may also distribute the longer lived carrier converted in a semiconductor substrate to other locations on the reaction surface where the carrier leaves the semiconductor, converts back into a ballistic carrier in a catalyst or reaction surface, and performs useful work. Such work includes stimulating reactions and energizing nano-mechanical devices or molecules. Examples of such nano-mechanical devices include a telescoping antenna, a nano-propeller, a C60 transistor, and the biological material kinesin.

In one embodiment, the present invention includes a method to transfer energetic, or hot, electrons and holes from the energized chemical products directly into the energy converter. Such a method may include forming the intervening path out of material with length short enough for ballistic charge carrier transport.

The method and system of the present invention in one embodiment creates the conditions on a reaction surface where the reaction paths strongly favor the generation of hot carriers or excitations that can be converted directly into useful potentials or excitations in a substrate. According to the methods of the present invention, such favorable conditions may be created, e.g., by tailoring the quantum states of the surface by the use of quantum wells; choosing catalysts and surface materials to favor energetic reactions; choosing reaction surface geometries with an enhanced concentration of the reaction sites favoring such excitations. Reaction surface geometries, e.g., may include steps and/or edge sites. The method of the present invention also may include choosing materials with Debye frequencies far from the desired excitation frequencies.

In one embodiment, the method includes forming the energy converter in contact with the reacting region. The term "contact" includes configurations where catalysts, materials, oxides or metals are placed between the energized products and the energy converter and used as a path for the energy transfer. This includes placing the converter near the reacting region, where "near" means within the distance that the excitation may either travel ballistically so that more than 5% of the excitations retain more than 95% of its energy or where resonant tunneling may transport the energy sufficiently fast that the no more than 95% of the energy is lost. The figure "95%" represents the attenuation effects of a distance approximately 3 times the energy mean free path of the charge carriers or electromagnetic coupling. The method also includes placing the converter on, adjacent to or under the reacting surface. This includes such configurations as deep V channels and mesa structures.

This forming a path of material for ballistic charge carrier transport includes limiting the path to a length less than approximately 4 times the energy mean free path of the charge carrier.

Forming of the path includes forming part of the path from materials including any of metals, semiconductors or insulators, and choosing materials with energy mean free paths in excess of 1 atom layer.

In one embodiment of the present invention, the highly energetic relaxation of a reaction product created on the catalyst surface transfers energy by injecting an electron or hole directly and ballistically into the catalyst surface. In this energy transfer process of the present invention, the vibrational excitation of the newly formed chemical specie executes a resonant tunneling of its energy into the energy levels of the substrate. These energy levels include the very broad band of available, unpopulated electron excitation states in either metals or semiconductor conduction bands. These energy levels include a similar band of hole states, when the excitation transfer due to energized products is a hole.

The emission of the electron or hot carrier in the present invention may utilize the inverse process of Desorption by Electronic Transitions (DIET) or Desorption by Multiple Electronic Transitions (DIMET).

Vibrationally excited anions (molecules or atoms with an extra negative charge) absorb an electron and re-emit an electron into the lattice, carrying with it most of the excitation energy. By analogy, cations (positively charged) emit an electron and reabsorb it, emitting a hole into the lattice, with the hole carrying the energy. The electron or hole is the hot carrier. According to one embodiment the present invention, the energy converter, such as the semiconductor or the quantum well in immediate contact with the substrate, converts the short-lived substrate hot carrier into a longer-lived carrier or excitation in the semiconductor or quantum well.

The method includes using a thin electrode as part of the reaction surface and substrate. The thickness of this electrode is preferably less than 3 times the energy mean free path of the hot electrons or hot holes produced by the energized products. This electrode may also be made of catalyst metal, as an option. When the electrode is made from good conductor metals such as copper, aluminum, silver and gold the appropriate energy mean free path thickness may be substantially greater than in catalyst such as platinum, palladium, iridium, rhodium, ruthenium, vanadia, titania, alumina, ruthenium oxide, oxides and other compounds. The thickness of materials forming the electrode may typically range from 0.3 to 300 nanometers, equivalent to approximately 1 to 1000 monolayers. The thickness of materials forming the catalysts may typically range from 0.3 to 50 nanometers.

The method includes forming electrodes that contain oxides, insulators and mixed catalysts, including but not limited to platinum, palladium, iridium, rhodium, ruthenium, vanadia, titania, alumina, ruthenium oxide, oxides and other compounds, whether or not these compounds are catalysts, insulators or conductors. For example, the method may include using ruthenium oxide, which is both an oxide and a conductor.

In one embodiment of the present invention, the catalyst surface is deliberately formed to favor hot carrier emission instead of substrate vibrations. The substrate vibrations are also known as phonons. The catalyst surface may also be formed to preserve the energy of the hot carrier. The material of the reacting surface may be chosen to have phonon bands with energy much lower than the multi-quantum vibrational relaxation. A reacting surface composed of heavy atoms such as a palladium or platinum catalyst exhibits such bands. Nearly all crystalline materials have the desired phonon band frequencies. Further, the surface is formed to be so thin that the hot carrier, an electron or hole, travels into the semiconductor supporting the catalyst before it looses very much of its energy. The dimension associated with this ballistic transport is approximately a small multiple of the energy mean free path of the hot carrier in the catalysts or substrate. The "small multiple" means that the thickness is thin enough so that the hot carrier or excitation does not loose so much energy that the remaining energy is an impractically low value. Typically, the energy diminishes exponentially with characteristic dimension "energy mean free path." A distance of "3" energy mean free paths means that less than 5% of the carriers have approximately the same energy as when they started.

Applying an electrical forward bias across the junction using external source of electricity creates a population inversion in those diodes and causes them to emit radiation. The method and apparatus of the present invention creates an identical forward bias using the hot carriers generated at the reaction surface and injected directly into the diode structure, instead of an external power supply. A laser diode or a light emitting diode configuration may be used in the present invention as an energy converter. An example of a laser diode configuration is a Double-heterostructure.

In one embodiment, the present invention includes a method of transferring reaction product excitations such as the energy of a dipole active state or a vibrational state, which are a type of excitation of the energized chemical products. The method includes enhancing resonant coupling between the energized products and the energy converter connected to the substrate.

This enhancing includes choosing operating biases that raise or lower the relative position of the energized products with respect to the energy levels of the energy converter, so as to match those energy levels. For example, the energy levels of a semiconductor diode energy converter include conduction band and valence band edges.

This enhancing includes forming a path between products and energy converter where the length of a path is less than ten times the dimension of the evanescent electromagnetic field region of the energized products.

In one embodiment, the dimension of the material between the reactants and the semiconductor substrate is less than the skin depth associated with the radiation transferring the energy. This embodiment is referred to as the "evanescent wave", where electromagnetic fields transfer the energy. In this embodiment of the present invention, instead of electron emissions and readsorption, the internal energy of the energized reaction products is resonantly transferred to the carriers of the semiconductor or quantum well, through the intermediate materials such as the catalyst and underlying substrate.

The method of the present invention includes choosing a dimension between energized products and energy converter that is short enough not to dissipate the transferred energy. For example, the physical path from the location of energized product on or near the reaction surface to the electrode underlayer or energy converter, such as a semiconductor diode, should preferably be less than 4 times the energy mean free path of an electron (or hole) traveling that path.

The energy mean free path dimension is typically between 1 and approximately 300 monolayers for catalysts in the platinum group at room temperature, which is the equivalent of approximately 0.3 and 100 nanometers. The energy mean free path can be in excess of 115 nanometers in gold for electrons with energy less than 1 eV and is calculated to be in excess of approximately 150 nanometers in silver for 1 eV electrons.

This forming the length of the ballistic transfer path includes fabricating a length through a conductor less than several times, e.g. four times, the energy mean free path of the ballistic carrier.

The forming the length of the radiation path includes fabricating a path using materials with thickness several times, e.g. 4 times, less than the penetration depth, or the equivalent to the dimension of the near field region of the multipole radiator carrying the energy.

Converting transferred excitations includes using energy converters such as a semiconductor or a quantum well, wherein short lived excitations such as hot carriers or energized product excitations are converted into longer lived excitations such as carriers in the semiconductor or quantum well.

The converting of excitations into useful forms includes conversion into an electrical potential, or into an inverted population of carriers suitable for stimulated emission of radiation, or into an abundance of energetic carriers that may themselves be used directly as energy sources.

In one embodiment, the present invention also includes a method for forming the energy converter from a semiconductor and converting the transferred excitations into excited carriers in the semiconductor.

The method for forming the energy converter includes choosing operating biases that raise or lower the relative position of the energy levels of the semiconductor diode, such as conduction or valence band edges so as to match those energy levels with those of the excited products.

The method may also include forming Schottky junction diodes. The method includes forming these junctions with barrier potential high enough to permit useful forward bias, which barrier is typically in excess of 0.05 volt. The bandgap of the Schottky junction may be any useful value, including values much greater than the energy of the electron, or in excess of 1.5 volts. Varying the semiconductor doping levels permits reducing the thickness of the barrier. A thin barrier permits electron tunneling, which in turn permits forming an almost ohmic junction when doping approaches degenerate doping.

The method includes choice of oxide layers, with thickness between 0.1 and 20 nanometers to form Schottky barriers and permits control of the barrier. Varying the thickness of the oxide controls the carrier tunneling through the oxide and hence the desired property of the junction. The oxide may be placed anywhere between the energized products and the semiconductor.

The method may also include forming p-n junction diodes, and especially diodes where one or both polarities of the diode are heavily doped or degeneratively doped. The method includes forming doping gradients, which may broaden or narrow the junction region.

It is recognized that the state of the are of constructing p-n junction diodes includes many variants. Such variants include various regions and combinations of metals, semiconductors, oxides and insulators outside of the diode. Some of these regions function to form ohmic or almost ohmic contacts to the diode. Other functions include lattice matching. The diode may be formed with any variants of doping profile. All such variants are functionally the same diode: a p-n junction diode.

The p-n junction energy converter of the present invention converts a very short-lived hot carrier, which is a ballistic electron or ballistic hole in the catalyst, into a much longer-lived minority carrier in a semiconductor. For example, a ballistic electron originates in the chemical product on or near the surface of the catalyst. It travels through the catalyst and any intermediate material and enters the semiconductor substrate. Once in the semiconductor, the hot carrier becomes a minority carrier. In one embodiment of the present invention, the polarity and bandgap of the semiconductor is deliberately chosen such that the hot carrier becomes a minority carrier when the hot carrier is in the semiconductor.

In one embodiment, the semiconductor is chosen to be p-type when the hot carrier is an electron. The p-type semiconductor is physically connected to the catalyst so that any potential barrier between them is very small or nonexistent. The catalyst metal is placed on a thin electrode metal, and the electrode material is bonded on the p-type semiconductor. The barrier in a metal-metal contact is negligible. Highly doping the semiconductor, including the limit of high doping called degenerative doping, and selecting the electrode material from the ones known to be compatible with forming an electrical contact to the semiconductor reduces the barrier between electrode and semiconductor. The electrode material may be another semiconductor, which is a method routinely used in the state of the art of semiconductor device fabrication. The result is that the catalyst Fermi level and the Fermi level of the p-type semiconductor valence band (the top edge of the lower band) are equal. The hot carrier energy is measured relative to that of the catalyst Fermi level. The result is that the hot carrier approaches the semiconductor with an energy above that of the catalyst Fermi level and therefore with approximately the same energy above the Fermi level of the p-type semiconductor.

The hot carrier then tries to enter the semiconductor with an excess energy above that of the catalyst and semiconductor valence band. By design, there are practically no energy levels in the bandgap of the semiconductor for an electron to excite. The only levels available in the semiconductor are in the upper band, the conduction band. In one embodiment of the present invention, the location of this upper band is chosen to be slightly less than the energy of the electron, so the electron can readily enter the semiconductor. This is achieved by forming the bandgap of the semiconductor to be less than the energy of this hot electron, or by choosing a semiconductor with the desired bandgap. This means that the hot electron enters the p-type semiconductor in its conduction band. This energizes the conduction band of the p-type semiconductor. The electron is thus converted into a minority carrier instead of a ballistic carrier. The minority carrier has a lifetime orders of magnitude longer than that of the ballistic carrier.

In one embodiment of the present invention, the semiconductor is chosen to be n-type when the hot carrier is a hole. The complimentary process as described with reference to p-type semiconductor is performed, producing the same result, i.e., the short-lived carrier into a longer-lived carrier.

Advantageously, semiconductor materials with both indirect and direct bandgaps are available with energies from the lowest practical, of order 0.05 eV to higher than the bond energies of most reactants, well in excess of 3 eV.

The lifetime of a minority carrier in a semiconductor is typically at least 100 times longer than that of a ballistic carrier. This longer lifetime gives the hot, minority carrier a chance to migrate, diffuse or be attracted by the semiconductor internal field to a region in the semiconductor of opposite type, namely an n-type semiconductor. The p-n junction creates a strong electric field across it and attracts minority carriers approaching it.

At the semiconductor junction, the minority carrier in the semiconductor finds exactly the same situation as it would find in a photovoltaic diode. As in a photovoltaic diode, the electric field of the p-n junction sweeps the hot carrier across the junction, forward biases the diode and generates a useful electrical potential.

In one embodiment, the p-type semiconductor diode layer thickness is chosen to be smaller than the energy mean free path of the minority carriers transporting the energy. This mean free path is often referred to as the diffusion length. Over distances longer than the diffusion length the carriers eventually recombine and generate heat.

The diode of the present invention in one embodiment is similar to a photovoltaic diode, but different in a key, non-obvious way. A photovoltaic diode must be formed with a junction region large enough to collect the light passing through it. This is typically much larger than a few hundred nanometers. To increase the light collection distance, the semiconductor junction must contain a relatively lower doped region. This constraint forces the doping of one of the n or p regions of the photovoltaic diode to be much less than what is considered to be heavy doping or degenerate doping. This lower doping level reduces the resistance area product of the diode and reduces its efficiency.

In one embodiment, the diode of the present invention does not need to collect such photons and does not need a large photon collection region. Therefore, the diode in the present invention may use the highly doped or degeneratively doped semiconductor for both polarities. This doping maximizes the resistance area product and therefore maximizes the diode efficiency. Therefore, the diode of the present invention can have both n and p regions that are highly or degeneratively doped. Unlike a photovoltaic diode, high doping increases the collection efficiency of the diode of the present invention.

Also, unlike a photon-collecting photovoltaic diode, the diode of the present invention has no constraint that limits the minimum distance to the p-n junction or on the thickness of the junction. This is advantageous since a high density of carriers in a heavily doped semiconductor decreases the diffusion length of the minority carriers in the diode and decreasing the diffusion length is not the most desired situation. Although this reduced diffusion length associated with the present invention may be of order 100 to 500 nanometers, such reduction is acceptable in the present invention because there is no constraint on the minimum distance to the p-n junction or on the thickness of the junction.

This lack of a constraint may be highly advantageous. Accordingly, the semiconductor may be degeneratively doped to a shallow depth, for example, 0.1 to 0.5 microns (100 to 500 nanometers). Highly doped and degenerative doped semiconductors may be used to minimize the distance from the catalyst and surface of the diode, where the hot carriers are generated, to the p-n junction, where the forward bias is developed. Thus the high doping and small p-n junction dimensions become a useful method. The high doping also permits use of relatively thin semiconductors, such as semiconductors less than 1 micron thick.

Calculations and models of an electric generator using the above-described methods and using electron energies expected for electron jump reactions suggest that efficiencies well in excess of 505 can be achieved with surface reaction power densities of order 10 watts per square centimeter. These values are consistent with existing and known catalysts and diodes.

With the unique method of the present invention, a high output power is maintained because the products of the reaction desorb and leave the catalyst, making room for more reactions of fuel and oxidizer at a rapid rate.

When the electron energy emitted by the energetic reactants is of order 1 volt, which exceeds thermal energy by at least an order of magnitude, semiconductors with bandgaps in this range, of order 1 volt, such as silicon may be used. In one embodiment, a method of the present invention uses such higher bandgap semiconductors and therefore permits the apparatus of the present invention to be operated at a temperature above room temperature, e.g. above 100 Celsius. This expands the range of catalysts and semiconductors that may be used and results in increased extractable power per area.

The method includes using indirect bandgap semiconductors such as silicon and germanium. Such materials typically show a longer carrier lifetime than direct bandgap semiconductors. This tends to increase the efficiency of the p-n junction embodiment.

The method includes using semiconductor compounds whose bandgap can be tailored by the choice of allow composition. These include the InGaAsSb family of semiconductors, where the bandgap can range from approximately 0.1 eV to above 1.5 eV depending on the ratio of In to Ga and the ratio of As to Sb.

The method includes operating the diode with a bias to enhance resonant tunneling. One way to do this when electron transfer dominates is to operate the diode with a forward bias such that the conduction band of the semiconductor matches an energy level of the excited products. When hole transfer dominates, matching of the valence band is appropriate.

The method includes using direct bandgap semiconductors such as those from the InGaAsSb family. Direct bandgap semiconductors permit configurations that extract energy by stimulated emission of radiation.

In one embodiment, the present invention includes a method to enhance the peak power and the rate of energy conversion by using the methods described above and further including enhancing the desorption of exhaust products from the reaction region.

The method for this enhancing includes choosing catalysts with relatively low affinity for exhaust products. The enhancing includes choosing catalysts from those that are less selective with respect to reactants is an advantage. Platinum, palladium and related catalysts have shown this property with respect to hydrogen and alcohol combustion.

The method includes bringing fuel and oxidizer into the region of reaction and permitting exhaust products to leave the reaction region. Exhaust products may migrate and diffuse away. One way to do this includes flowing gaseous reactants over the reaction surface and letting the exhaust products leave the surface into the gas flow.

Quantum wells offer the possibility of creating resonances to capture the reactant excitations. According to the state of the art, external electric currents energize quantum wells and dots formed into near ideal 4 level lasers. According to the present invention, the same kinds of wells and dots may be energized directly from the energy of reactants.

In one embodiment, an apparatus of the present invention includes a reaction region and surface with a catalyst and upon which reactants form energized specie and emit charge carriers. An energy converter is placed within a distance less than 10 times the energy mean free path of excitations carrying the energy to an energy converter. An energy converter in the apparatus includes a semiconductor p-n junction.

Figure 1:
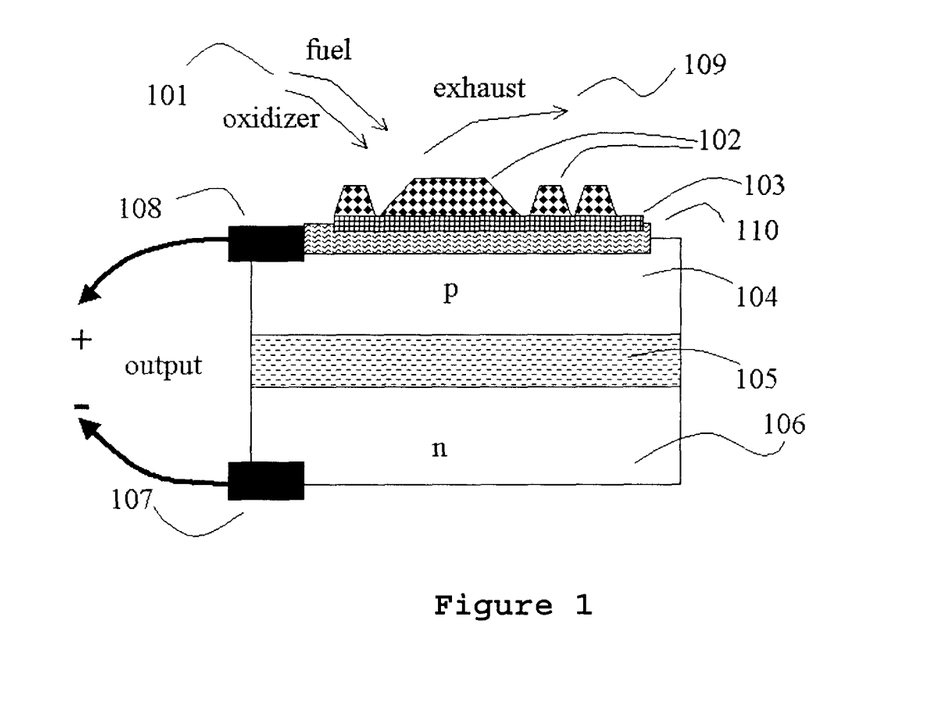
FIG. 1 shows a schematic cross section of an electric generator using the p-n junction.

FIG. 1 shows a cross section of an apparatus in one embodiment of the present invention for the case where hot, energetic electrons are the form of energy created as the result of reactions and where a p-n junction diode converts the electrons into useful forms of energy such as electricity. Fuel and oxidizer reactants 101 flow into the reaction region including catalyst 102 and substrate 103, and exhaust products 109 leave the reaction region.

Reactions occur on the surface of the catalysts 102 and substrate 103. Catalyst structures 102 are shown as layers or clusters formed on the substrate 103. The substrate 103 may contain materials such as catalyst materials, oxides, non-conductors and alloys including catalyst material and is a part of the reaction region. A thin substrate 110 physically connects the reaction region including catalysts 102 and substrate 103 to the diode p-type semiconductor element 104.

Substrates 103 and 110 are shown separately to illustrate that material constraints may force the need for one type of material forming a substrate on which to form catalyst structures and reaction surfaces, and for another type of material to form an ohmic or almost ohmic connection to the semiconductor. When materials are compatible, either substrate may be formed from the semiconductor itself, or either substrate may be formed form the catalyst itself, or combinations thereof. For example, when the semiconductor is very heavily doped, which is also referred to as degeneratively doped, then the catalyst metal may form an ohmic junction or an almost ohmic junction to the semiconductor. In this case, the catalyst may act as the substrate 110 to connect the reaction region to the semiconductor. Further, as another example, if the catalyst forms the desired structures directly on the semiconductor, then the catalyst itself may form its own substrate 103.

The hot electrons created on the reaction surface 102 and 103 travel through the thin substrate 110 and into the p-type semiconductor 104 where the electrons are converted into minority carriers in the semiconductor. Charge balance occurs by the transfer of a hole from the p-type semiconductor into the reaction region. The minority carriers travel to the p-n junction 105 of the diode both by diffusion and by reason of the internal electric field of the junction 105. The internal electric field causes the carriers to become majority carriers in the n-type semiconductor 106 of the diode, causing the diode to become forward biased.

Electricity is generated by reason of the forward bias developed across the diode and is extracted as a forward current between the positive electrode 108 and the negative electrode 107.

Figure 2:
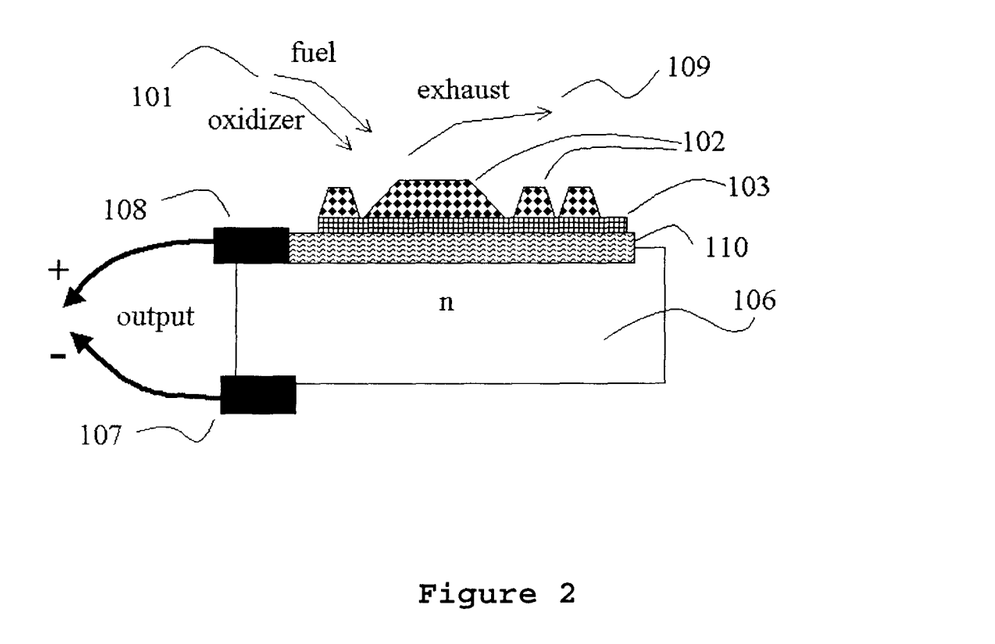
FIG. 2 shows a schematic cross section of an electric generator using the Schottky junction.

FIG. 2 shows a cross section of the apparatus of the present invention in one embodiment for the case where electrons are the created as the result of reactions and where a Schottky junction diode converts the electrons into useful forms of energy such as electricity. As in FIG. 1, fuel and oxidizer reactants 101 flow into the reaction region 102 and 103 and exhaust products 109 leave the reaction region. Reactions occur on the catalyst structures 102, shown as layers or clusters, and may occur on the substrate 103 as in the previous embodiment.

The substrate 110 is a metal chosen to form a Schottky barrier at the metal-semiconductor junction. The metal substrate 110 therefore also forms the electrical connection to the diode, also referred to as the diode electrode.

Some of the hot electrons created on the reaction surface and region 102 and 103 have energy greater than the Schottky barrier between the diode electrode 110 and semiconductor 106. These electrons travel ballistically over this barrier and enter the n-type semiconductor 106 where they become majority carriers in the semiconductor.

Collisions with the lattice and electrons in the semiconductor degrade the excess energy to a value substantially less than the barrier. The result of this energy loss is to diminish the number of electrons that travel in the reverse direction. This permits a forward bias on the diode to develop.

Electricity is generated by reason of the forward bias generated as a result of the hot electron transfer across the diode metal semiconductor junction and is extracted as a forward current between the positive electrode 108 and the negative electrode 107.

In one embodiment, a method to collect the energy of surface reactions includes using a diode similar to that used in ballistic electron generation and detection, e.g., a Schottky diode. In this embodiment, a catalyst and reactant flow similar to that used in the p-n junction diode device may also be used. The thin catalyst is supported on a substrate formed by a thin electrode of a Schottky diode. The thin electrode may also be formed from the same materials as the catalysts.

In one embodiment of the present invention, a Schottky junction typically includes a metal deposited on a doped semiconductor. A Schottky junction to capture hot electrons in the present invention may be made by bonding a metal, including catalyst metals such as platinum, directly to the surface of an n-type silicon semiconductor. A voltage barrier develops within approximately several atomic monolayers of the metal-semiconductor junction, between the metal and the semiconductor, with value typically between 0.4 and 0.9 electron volts.

A ballistic electron generated in the diode metal electrode may directly pass into the semiconductor if its energy is greater than the Schottky barrier. That is, if the electron has greater than about 0.4 to 0.9 eV above the catalyst Fermi level, it will ballistically travel directly over the Schottky barrier. The hot electron then collides with other electrons or atoms in the semiconductor. Within the length equal to a few times its energy mean free path in the semiconductor the hot electron becomes just a thermal, majority carrier electron. Its energy is now far below the Schottky barrier and it cannot travel back into the metal. This causes a forward bias on the diode. The result is the conversion of hot electron energy into a measurable current through the diode and may result in a measurable voltage across the diode.

The ballistic electron may travel into the diode if it does not decay first. The ballistic electron will not decay if the energy mean free path in the catalyst and diode electrode metal is longer than the distance the electron has to go to get into the diode. This dimension is typically of order 100 nanometers, or 300 monolayers, or less. An advantage of using a Schottky junction energy converter is the simplicity of the device.

Figure 3:
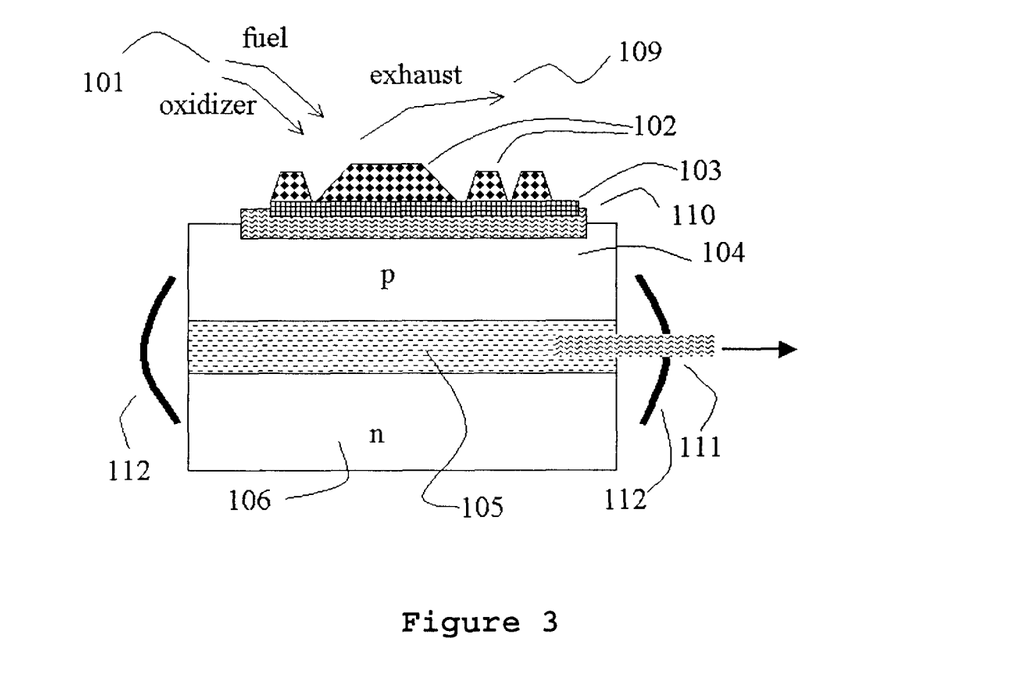
FIG. 3 shows a schematic cross section of a laser radiation source using the p-n junction diode to generate a useful radiation from chemical reaction energies.

FIG. 3 shows a cross section of the apparatus in one embodiment of the present invention where electrons are created as a result of reactions and result in a population inversion of carriers in the diode junction region. Stimulated emission of radiation with photon energy approximately equal to that of the bandgap removes energy from the system in the form of electromagnetic radiation, including coherent radiation.

In one embodiment, the chemical reactions inject hot electrons into the p-n junction diode in a similar manner described with reference to FIG. 1. The diode becomes forward biased. The electrons and holes are allowed to accumulate instead of being used as an electrical energy source. The result is a population inversion of electrons and holes. The electrons and holes recombine, emitting photons with energy approximately equal to the bandgap.

Tailoring junction region of a diode by doping p and n regions promotes flooding of the junction with both electrons and holes. The junction region thereby acquires an inverted population. Choosing a semiconductor to be a direct bandgap material promotes photon radiation over phonon emission.

An optical cavity 112 provides the means to extract the energy in the form of coherent radiation 111 by means of stimulated emission. The optical cavity shown in FIG. 3 is shown as an example only. Other optical cavities may also be employed. Those skilled in the technological art will appreciate that there are many known ways to couple an energized semiconductor system to an optical cavity to produce radiation and coherent radiation output.

As described above, the method for generating electricity in the present invention includes using reactants to supply the energy; using one or more catalysts to form energized chemical products in the near-field proximity to or on an energy converter; using the energy converter to collect and transfer energy forms, also called excitations, which are emitted by the energized reaction products. The method may also include forming the catalysts, interconnections and substrates such that the distance from the reacting chemicals to the energy converter is less than approximately 4 times the various energy mean free paths of the forms of energy going into the energy converter.

The method of the present invention may also include converting charge carrier energy into difference in Fermi level, also known as chemical potential, across a diode junction. The diode may a Schottky junction diode and also may be formed from a bipolar semiconductor material such as InGaAsSb. InGaAsSb ratio may be tailored to provide a bandgap that matches energy transitions of excited products.

The diode in the present invention used to collect electrons may be formed using an n-type semiconductor. The diode in the present invention used to collect holes may be formed using a p-type semiconductor. The diode may be formed with low barrier, e.g., by doping the semiconductor highly or degeneratively to reduce the barrier. The semiconductor may also be doped in excess of 1E18 per cubic centimeter.

The diode in the present invention may be formed with an oxide barrier between the catalyst and the diode. The barrier may be placed between the electrode of the diode and the semiconductor of the diode. The barrier may also be placed between the catalyst and the semiconductor of the diode. The barrier may also be placed between the energized products and the diode.

The barrier thickness may be formed to be less than the ballistic transport dimension for the charge carrier that forward biases the diode. The barrier thickness may be, e.g., less than 100 nanometers.

In the present invention, the diode may be forward biased so that its conduction band matches a desired energy level of the excited state products. The diode may be operated with a forward bias in excess of 0.05 volts. The diode may be formed so that its conduction band matches a desired energy level of the excited state products.

As described above, the diode may be a p-n junction diode. The p-n junction diode that collects electrons is formed such that a first electrode of the diode, which is in contact with the reacting surface, is in contact with a p-type semiconductor. An n-type semiconductor is formed adjacent to the p-type semiconductor, forming the p-n junction, and the second electrode of the diode is in contact with the n-type semiconductor.

The p-n junction diode that collects holes is formed such that a first electrode of the diode, which is in contact with the reacting surface, is in contact with a n-type semiconductor. A p-type semiconductor is formed adjacent to the n-type semiconductor, forming the p-n junction, and the second electrode of the diode is in contact with the p-type semiconductor.

The p-n junction diode may be formed from a semiconductor with bandgap matching a desired energy level transition of the energized products on the surface of the catalyst. The p-n junction diode may also be formed with a low Schottky barrier between an electrode and the semiconductor. The barrier may be formed to be less than 0.4 eV. The semiconductor in the p-n junction diode may be doped highly or degeneratively to reduce the barrier. For example, the semiconductor may be doped in excess of 1E18 per cubic centimeter. The p-n junction may be formed from a bipolar semiconductor or from a direct bandgap semiconductor.

The p-n junction diode may be forward biased so that its conduction band matches a desired energy level of the excited state products. The p-n junction diode may be formed with a bandgap in excess of 0.04 volts.

The method of the present invention also includes forming the connection between energized products and semiconductor to create for an energetic electron or hole formed outside the semiconductor a ballistic or tunneling path into the conduction band of semiconductor for an electron and the valence band for hole.

The connection may be formed with a vacuum path dimension less than 20 nanometers and a material path less than 100 nanometers between energized products and semiconductor.

In the present invention, the catalyst structures may be formed into quantum well structures, such as layers, islands, pancakes and quantum dots, where e.g., the structures may contain less than 200 atoms. The catalyst structures may also be formed into atomically smooth superlattices. The catalyst structures may be formed with dimensions less than 10 monolayers, e.g., where the monolayers contain less than 200 atoms. The catalysts may be formed, e.g., from gold, silver, copper, or nickel.

The energy converter in the present invention may be formed by various combinations of metal-semiconductor-oxide structures. An electrode interlayer connecting catalyst to semiconductor may be formed to provide an electrical connection to semiconductor. The interlayer thickness may be less than the mean free path of the charge carriers causing forward bias of the diode, e.g., less than 200 nanometers. The interlayer may be formed from metals compatible with forming an electrode to the semiconductor. Examples of such metals include Mg, Sb, Al, Ag, Sn, Cu or Ni. The interlayer may be formed from metals that match the lattice parameter of the catalyst to the interlayer. As described above, the method of the present invention may include mixing fuel and air in the channel providing reactants to the catalyst surface.

In one embodiment, the energy converter of the present invention is placed next to, below or under the catalyst. Charge carrier motion is converted into an inverted population of carriers in a p-n junction diode and the energy stored in the carriers is extracted using stimulated emission.

In one embodiment, the diode in the present invention is formed from direct bandgap semiconductors. The diode may be coupled to the on optical cavity. The diode is formed from a semiconductor with bandgap matching a desired energy level transition of the energized products on the surface of the catalyst. The p-n junction diode may be formed with a low Schottky barrier between an electrode and the semiconductor such that the barrier is less than 0.4 eV. The barrier may be reduced by doping the semiconductor highly or degeneratively, e.g., doping the semiconductor in excess of 1E18 per cubic centimeter.

A connection may be formed between energized products and diode having a ballistic or tunneling path for an energetic electron or hole formed outside the semiconductor to force itself into the conduction band of semiconductor for an electron and the valence band for hole. The connection may be formed with a vacuum path dimension less than 20 nanometers and an material path less than 100 nanometers.

The energy converter in this embodiment may include structures into quantum well structures, such as layers, islands, pancakes and quantum dots, where the structures contain less than 200 atoms and/or where the structures contain less than 300 monatomic layers. The catalyst structures may be formed into atomically smooth superlattices. The catalyst structures may also be formed with dimensions less than 10 monolayers, e.g., where the structures contain less than 200 atoms. The catalyst may, e.g., formed from gold, silver, copper and nickel.

An electrode interlayer may be formed to connect the catalyst to semiconductor to provide an electrical connection to semiconductor. The interlayer thickness may be formed to be less than mean free path of the charge carriers causing forward bias of the diode, e.g., a thickness less than 200 nanometers. Metals compatible with forming an electrode with the semiconductor may be used to form the interlayers. Examples of these metals include Mg, Sb, Al, Ag, Sn, Cu or Ni. The interlayer may also be formed from metals that match the lattice parameter of the catalyst to the interlayer.

The present invention also includes an apparatus for generating electricity. The apparatus includes a reactant flow system where reactants enter and exhaust products leave the vicinity of the reaction surface; a reaction surface containing a catalyst and upon which reactants may form energized specie in close proximity to an energy converter connected to the surface; and an energy converter such as a semiconductor. For example, as described above, the energy converter may be a Schottky diode. Alternatively, the energy converter is a p-n junction diode.

The present invention also includes an apparatus for generating coherent radiation. The apparatus includes a reactant flow system where reactants enter and exhaust products leave the vicinity of the reaction surface; a reaction surface containing a catalyst and upon which reactants may form energized specie in close proximity to an energy converter connected to the surface; and energy converter attached to a reaction surface including a p-n junction semiconductor. In one embodiment, the p-n junction diode is coupled to an optical cavity.

While the invention has been particularly shown and described with respect to particular embodiments thereof, it will be understood by those skilled in the art that the foregoing and other changes in form and details may be made therein without departing from the spirit and scope of the invention.

The invention claimed is:

1. A method for converting chemical energy into a useful form comprising:
    using reactants and catalyst to create highly vibrationally excited molecules, the highly vibrationally excited molecules being created in a catalytic reaction where at least some of products of the catalytic reaction desorb and leave a surface of the catalytic reaction;
    coupling the highly vibrationally excited molecules with electrons by placing the highly vibrationally excited molecules near a conducting surface for electron jump effect to occur;
    causing at least some of vibrational energy of the highly vibrationally excited molecules to transfer to the electrons of the conducting surface, resulting in excited carriers being created;

collecting the excited carriers using a semiconductor diode; and converting energy of the excited carriers into electrical energy.

2. A method for converting chemical energy into a useful form comprising:

using reactants and catalyst to create highly vibrationally excited molecules, the highly vibrationally excited molecules being created in a catalytic reaction where at least some of products of the catalytic reaction desorb and leave a surface of the catalytic reaction;

coupling the highly vibrationally excited molecules with electrons by placing the highly vibrationally excited molecules near a conducting surface for electron jump effect to occur;

causing at least some of vibrational energy of the highly vibrationally excited molecules to transfer to the electrons of the conducting surface, resulting in excited carriers being created;

collecting the excited carriers using a bipolar semiconductor; and converting energy of the excited carriers into electrical energy.

3. A method for converting chemical energy into a useful form comprising:

using reactants and catalyst to create highly vibrationally excited molecules, the highly vibrationally excited molecules being created in a catalytic reaction where at least some of products of the catalytic reaction desorb and leave a surface of the catalytic reaction;

coupling the highly vibrationally excited molecules with electrons by placing the highly vibrationally excited molecules near a conducting surface for electron jump effect to occur;

causing at least some of vibrational energy of the highly vibrationally excited molecules to transfer to the electrons of the conducting surface, resulting in excited carriers being created;

collecting the excited carriers using an n-type semiconductor; and converting energy of the excited carriers into electrical energy.

4. A method for converting chemical energy into a useful form comprising:

using reactants and catalyst to create highly vibrationally excited molecules, the highly vibrationally excited molecules being created in a catalytic reaction where at least some of products of the catalytic reaction desorb and leave a surface of the catalytic reaction;

coupling the highly vibrationally excited molecules with electrons by placing the highly vibrationally excited molecules near a conducting surface for electron jump effect to occur;

causing at least some of vibrational energy of the highly vibrationally excited molecules to transfer to the electrons of the conducting surface, resulting in excited carriers being created;

collecting the excited carriers using a p-type semiconductor diode; and converting energy of the excited carriers into electrical energy.

5. A method for converting chemical energy into a useful form comprising:

using reactants and catalyst to create highly vibrationally excited molecules, the highly vibrationally excited molecules being created in a catalytic reaction where at least some of products of the catalytic reaction desorb and leave a surface of the catalytic reaction;

coupling the highly vibrationally excited molecules with electrons by placing the highly vibrationally excited molecules near a conducting surface for electron jump effect to occur;

causing at least some of vibrational energy of the highly vibrationally excited molecules to transfer to the electrons of the conducting surface, resulting in excited carriers being created;

collecting the excited carriers using a p-n junction diode; and converting energy of the excited carriers into electrical energy.

* * * * *